(12) United States Patent
Sakui et al.

(10) Patent No.: US 12,185,522 B2
(45) Date of Patent: *Dec. 31, 2024

(54) MEMORY APPARATUS USING SEMICONDUCTOR DEVICES

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

(*) Notice: Subject to any disclaimer, the term of this patent is extended or adjusted under 35 U.S.C. 154(b) by 414 days.

This patent is subject to a terminal disclaimer.

(21) Appl. No.: 17/735,431

(22) Filed: May 3, 2022

(65) Prior Publication Data

US 2022/0359521 A1 Nov. 10, 2022

(30) Foreign Application Priority Data

May 6, 2021 (WO) .................. PCT/JP2021/017352

(51) Int. Cl.
  *H10B 12/00* (2023.01)
  *G11C 11/4091* (2006.01)
  *G11C 11/4097* (2006.01)

(52) U.S. Cl.
  CPC .......... *H10B 12/20* (2023.02); *G11C 11/4091* (2013.01); *G11C 11/4097* (2013.01)

(58) Field of Classification Search
  CPC ...... H10B 12/20; H10B 12/036; H10B 12/05; H10B 12/33; G11C 11/4091;
  (Continued)

(56) References Cited

U.S. PATENT DOCUMENTS

| 11,990,204 B2* | 5/2024 | Sakui ..................... H10B 12/30 |
| 2003/0111681 A1 | 6/2003 | Kawanaka |

(Continued)

FOREIGN PATENT DOCUMENTS

| JP | H 02-188966 A | 7/1990 |
| JP | H 03-171768 A | 7/1991 |

(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, 99. 573-578 (1991).

(Continued)

*Primary Examiner* — J. E. Schoenholtz
(74) *Attorney, Agent, or Firm* — Crowell & Moring LLP

(57) ABSTRACT

A memory apparatus includes pages each including a plurality of memory cells arranged in a column on a substrate. A voltage applied to each of a first gate conductor layer, a second gate conductor layer, a first impurity layer, and a second impurity layer in each memory cell included in each page is controlled to perform a page write operation for retaining holes, which have been formed through an impact ionization phenomenon or using a gate induced drain leakage current, in a channel semiconductor layer, or a voltage applied to each of the first gate conductor layer, the second gate conductor layer, a third gate conductor layer, a fourth gate conductor layer, the first impurity layer, and the second impurity layer is controlled to perform a page erase operation for removing the holes from the channel semiconductor layer. The first impurity layer in the memory cell connects to a source line. The second impurity layer connects to a bit line. One of the first gate conductor layer and the second gate conductor layer connects to a word line, and the other (Continued)

connects to a first drive control line. The bit line connects to a sense amplifier circuit via a switch circuit. During a page read operation, page data in a group of memory cells selected by the word line is read by the sense amplifier circuit. During each of the page write operation, the page erase operation, and the page read operation, an identical fixed voltage is applied to the first drive control line.

9 Claims, 20 Drawing Sheets

(58) Field of Classification Search
CPC ....... G11C 11/4097; G11C 5/025; G11C 7/02; G11C 11/4094; G11C 2211/4016; G11C 11/404

See application file for complete search history.

(56) References Cited

U.S. PATENT DOCUMENTS

| | | | |
|---|---|---|---|
| 2006/0049444 A1 | 3/2006 | Shino | |
| 2008/0137394 A1 | 6/2008 | Shimano | |
| 2008/0212366 A1 | 9/2008 | Ohsawa | |
| 2009/0251959 A1* | 10/2009 | Fukuda | G11C 11/404 365/174 |

FOREIGN PATENT DOCUMENTS

| | | |
|---|---|---|
| JP | 2006-080280 A | 3/2006 |
| JP | 3957774 B2 | 8/2007 |
| JP | 2008-218556 A | 9/2008 |

OTHER PUBLICATIONS

H. Chung, H. Kim, H. Kim, K. Kim, S. Kim, K. Dong, J. Kim, Y. C. Oh, Y. Hwang, H. Hong, G. Jin, and C. Chung: "Novel 4F2 DRAM Cell with Vertical Pillar Transistor (VPT)," 2011 Proceeding of the European Solid-State Device Research Conference, (2011).

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No 12, December, pp. 2201-2227 (2010).

T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, 99. 1-9 (2015).

M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, vol. 31, No. 5, pp. 405-407 (2010).

J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).

T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32mm Node and Beyond," IEEE IEDM (2006).

E. Yoshida and T. Tanaka: "A Design of a Capacitorless 1T-DRAM Cell Using Gate-induced Drain Leakage (GIDL) Current for Low-power and High-speed Embedded Memory," IEEE IEDM, pp. 913-916, Dec. 2003.

J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.

N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, Jun. 2017.

H. Jiang, N. Xu, B. Chen, L. Zeng1, Y. He, G. Du, X. Liu and X. Zhang: "Experimental investigation of self heating effect (SHE) in multiple-fin SOI FinFETs," Semicond. Sci. Technol. 29 (2014) 115021 (7 pp).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI,"IEICE Trans. Electron, vol. E90-c., No. 4 pp. 765-771 (2007).

International Search Report (PCT/ISA/210) (Japanese) from PCT/JP2021/017352 dated Jun. 29, 2021, 3 pgs. See a translation identified as A26.

English translation of International Search of Search Report (PCT/ISA/210) of PCT/JP2021/017352, 2 pgs.

Written Opinion (PCT/ISA/237) (Japanese) of PCT/JP2021/017352 dated Jun. 22, 2021, 3 pgs.

F. Morishita, H. Noda, I. Hayashi, T. Gyohten, M. Okamoto, T. Ipposhi, S. Maegawa, K. Dosaka, and K. Arimoto: "A Capacitorless Twin-Transistor Random Access Memory (TTRAM) on SOI," IEICE Trans. Electron, vol. E90-c., No. 4 pp. 765-771 (2007) a brief description attached.

* cited by examiner $C_{FB} = C_{WL} + C_{PL} + C_{BL} + C_{SL}$ (1)

$\beta_{WL} = \dfrac{C_{WL}}{C_{WL} + C_{PL} + C_{BL} + C_{SL}}$ (2) ⇨ SMALL $\beta_{WL}$ $\beta_{PL} = \dfrac{C_{PL}}{C_{WL} + C_{PL} + C_{BL} + C_{SL}}$ (3) ⇨ LARGE $\beta_{PL}$ $\beta_{BL} = \dfrac{C_{BL}}{C_{WL} + C_{PL} + C_{BL} + C_{SL}}$ (4) ⇨ SMALL $\beta_{BL}$ $\beta_{SL} = \dfrac{C_{SL}}{C_{WL} + C_{PL} + C_{BL} + C_{SL}}$ (5) ⇨ SMALL $\beta_{SL}$ $\Delta V_{FB} = V_{FBH} - V_{FBL} = \underline{\dfrac{\beta_{WL} \times V_{WLH}}{\text{SMALL}}}$ (6)

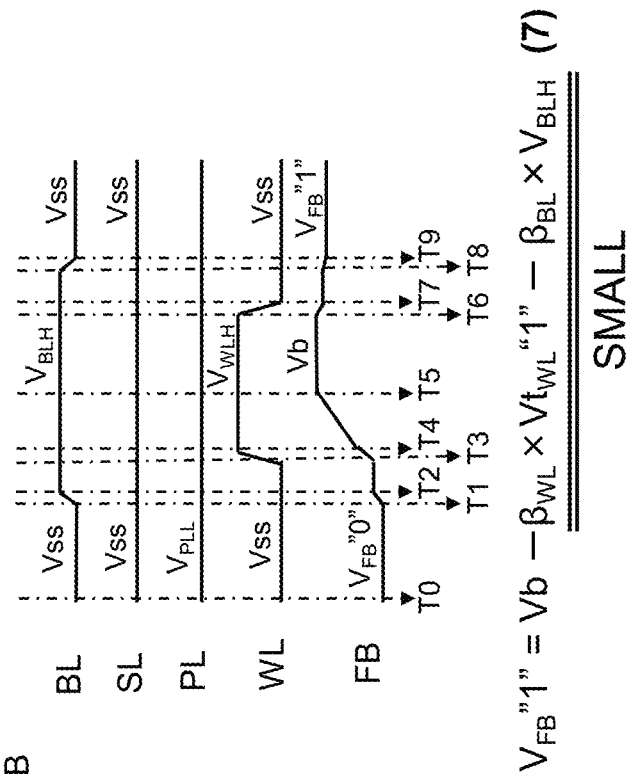
FIG. 3AB
$$V_{FB}\text{"1"} = Vb - \beta_{WL} \times Vt_{WL}\text{"1"} - \beta_{BL} \times V_{BLH} \quad (7)$$
SMALL
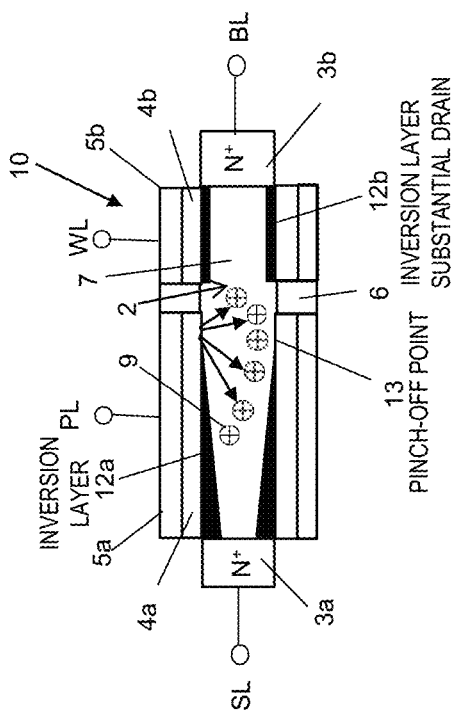
FIG. 3AA "1" PAGE WRITE OPERATION
SOURCE-SIDE IMPACT IONIZATION
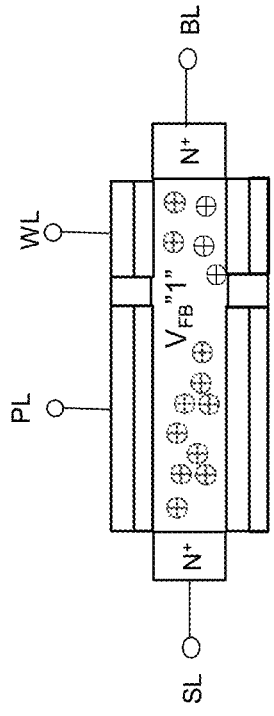
FIG. 3AC "1" WRITTEN STATE

FIG. 4BB "1" WRITTEN STATE (T0)

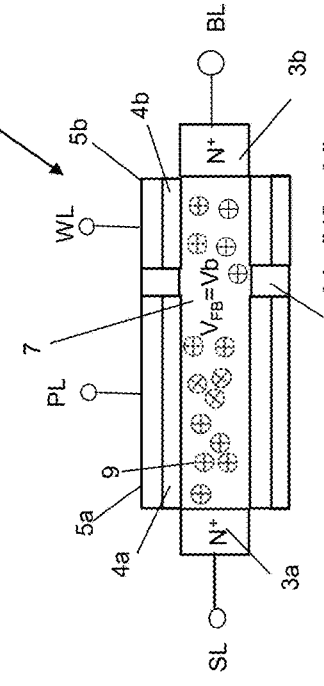
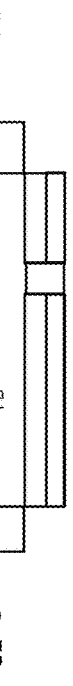
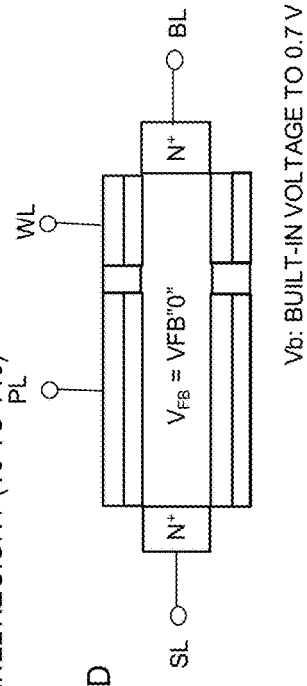

$$V_{FB}\text{"1"} = Vb - \beta_{WL} \times Vt_{WL}\text{"1"} \quad (7)$$

$Vb$ IS BUILT-IN VOLTAGE $$V_{FB}\text{"0"} = Vb - \beta_{WL} \times V_{WLH} - \beta_{PL} \times (V_{PLH} - V_{PLL}) - \beta_{BL} \times V_{BLH} \quad (8)$$

$$\Delta V_{FB} = V_{FB}\text{"1"} - V_{FB}\text{"0"}$$
$$= \beta_{WL} \times V_{WLH} + \beta_{PL} \times (V_{PLH} - V_{PLL}) - \beta_{WL} \times Vt_{WL}\text{"1"} - \beta_{BL} \times V_{BLH} \quad (9)$$

DURING "0" ERASE OPERATION, EACH OF WORD LINE WL AND PLATE LINE PL IS CAPACITIVELY COUPLED TO CHANNEL REGION 7 (T9 TO T10)

FIG. 4BD

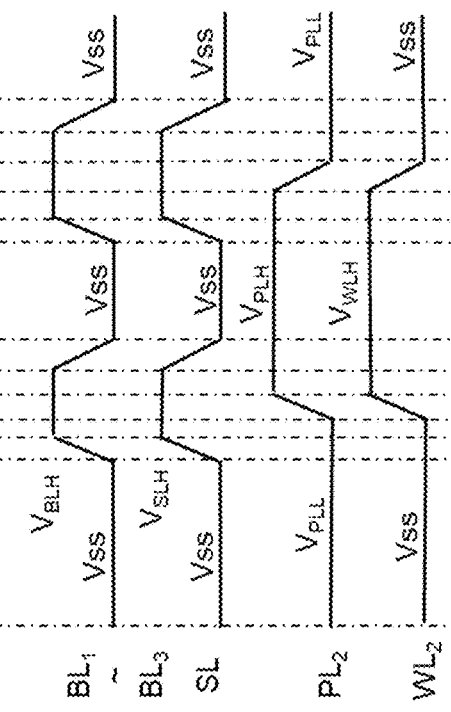

FIG. 4BA TIMING CHART OF "0" PAGE ERASE OPERATION

T3~T4: FIRST PERIOD
T5~T6: SECOND PERIOD
T9~T10: THIRD PERIOD

DURING "0" ERASE OPERATION, HOLES 9 ARE DISCHARGED (T5 TO T6)

FIG. 4BC

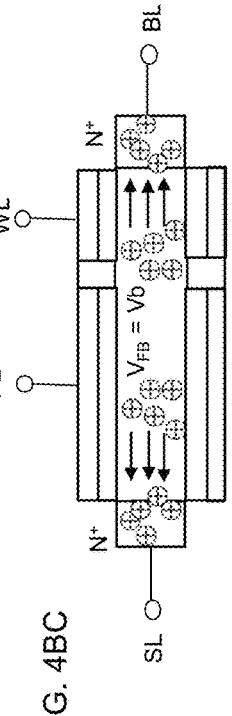

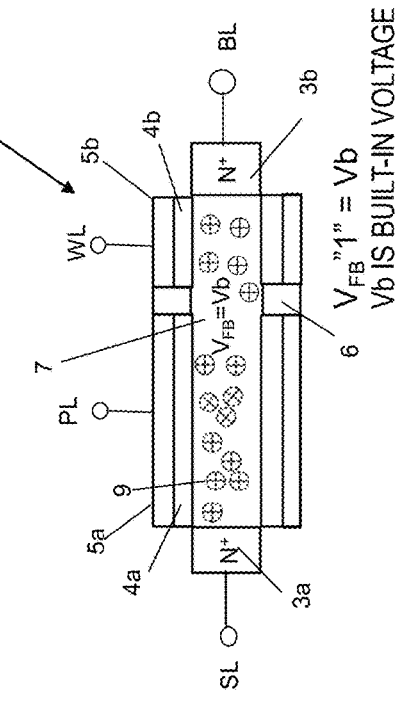

FIG. 4DA TIMING CHART OF "0" PAGE ERASE OPERATION

T3~T4: FIRST PERIOD
T5~T6: SECOND PERIOD
T9~T10: THIRD PERIOD

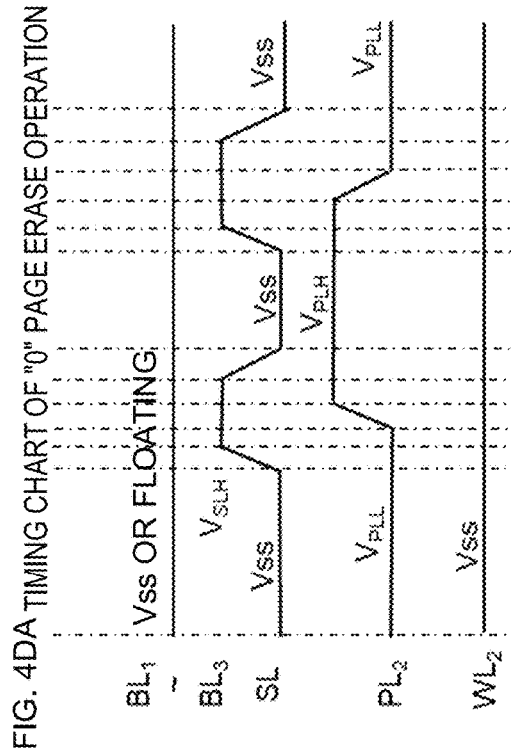

FIG. 4DB "1" WRITTEN STATE (T0)

$V_{FB}\text{"1"} = Vb$ 
Vb IS BUILT-IN VOLTAGE (7)

$V_{FB}\text{"0"} = Vb - \beta_{WL} \times V_{WLH} - \beta_{PL} \times (V_{PLH} - V_{PLL})$ (8)

$\Delta V_{FB} = V_{FB}\text{"1"} - V_{FB}\text{"0"}$
$= \beta_{WL} \times V_{WLH} + \beta_{PL} \times (V_{PLH} - V_{PLL}) - \beta_{WL} \times Vt_{WL}\text{"1"} - \beta_{BL} \times V_{BLH}$ (9)

DURING "0" ERASE OPERATION, EACH OF WORD LINE WL AND PLATE LINE PL IS CAPACITIVELY COUPLED TO CHANNEL REGION 7 (T9 TO T10)

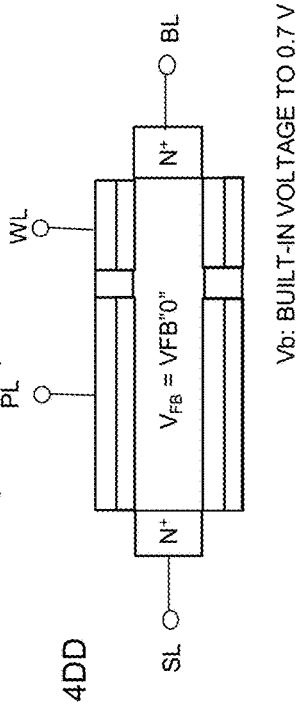

FIG. 4DD

Vb: BUILT-IN VOLTAGE TO 0.7 V

DURING "0" ERASE OPERATION, HOLES 9 ARE DISCHARGED (T5 TO T6)

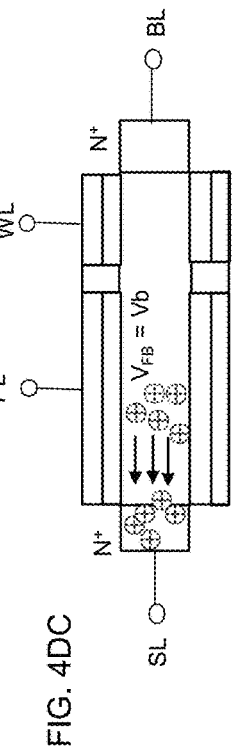

FIG. 4DC

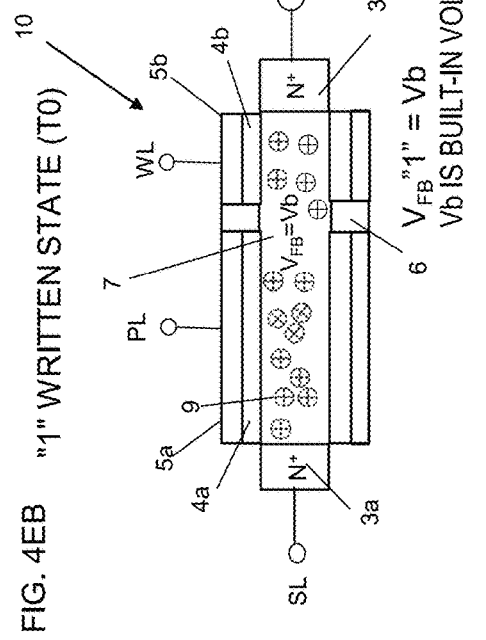

FIG. 4EA TIMING CHART OF "0" PAGE ERASE OPERATION

T3~T4: FIRST PERIOD
T5~T6: SECOND PERIOD
T9~T10: THIRD PERIOD

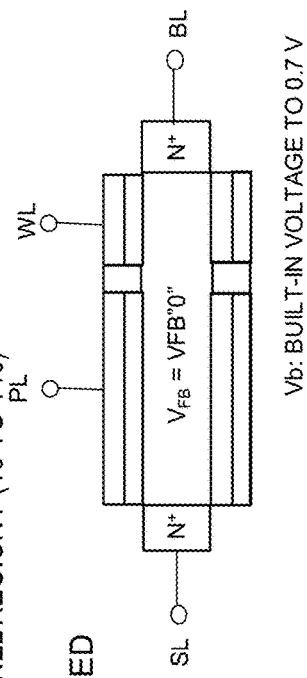

FIG. 4EB "1" WRITTEN STATE (T0)

$$V_{FB}\text{"}1\text{"} = Vb \quad (7)$$

Vb IS BUILT-IN VOLTAGE $$V_{FB}\text{"}1\text{"} = Vb - \beta_{WL} \times Vt_{WL}\text{"}1\text{"} - \beta_{BL} \times V_{BLH} \quad (7)$$

$$V_{FB}\text{"}0\text{"} = Vb - \beta_{WL} \times V_{WLH} - \beta_{PL} \times (V_{PLH} - V_{PLL}) \quad (8)$$

$$\Delta V_{FB} = V_{FB}\text{"}1\text{"} - V_{FB}\text{"}0\text{"}$$
$$= \beta_{WL} \times V_{WLH} + \beta_{PL} \times (V_{PLH} - V_{PLL}) - \beta_{WL} \times Vt_{WL}\text{"}1\text{"} - \beta_{BL} \times V_{BLH} \quad (9)$$

DURING "0" ERASE OPERATION, EACH OF WORD LINE WL AND PLATE LINE PL IS CAPACITIVELY COUPLED TO CHANNEL REGION 7 (T9 TO T10)

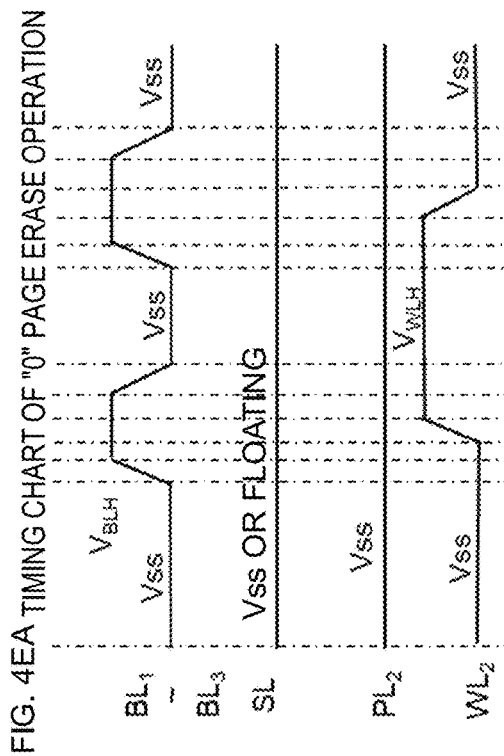

DURING "0" ERASE OPERATION, HOLES 9 ARE DISCHARGED (T5 TO T6)

FIG. 4EC

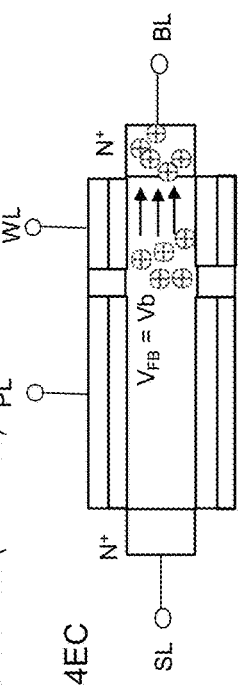

Vb: BUILT-IN VOLTAGE TO 0.7 V

FIG. 4ED

"1" WRITTEN STATE

"0" ERASE STATE

Vb: BUILT-IN VOLTAGE TO 0.7 V

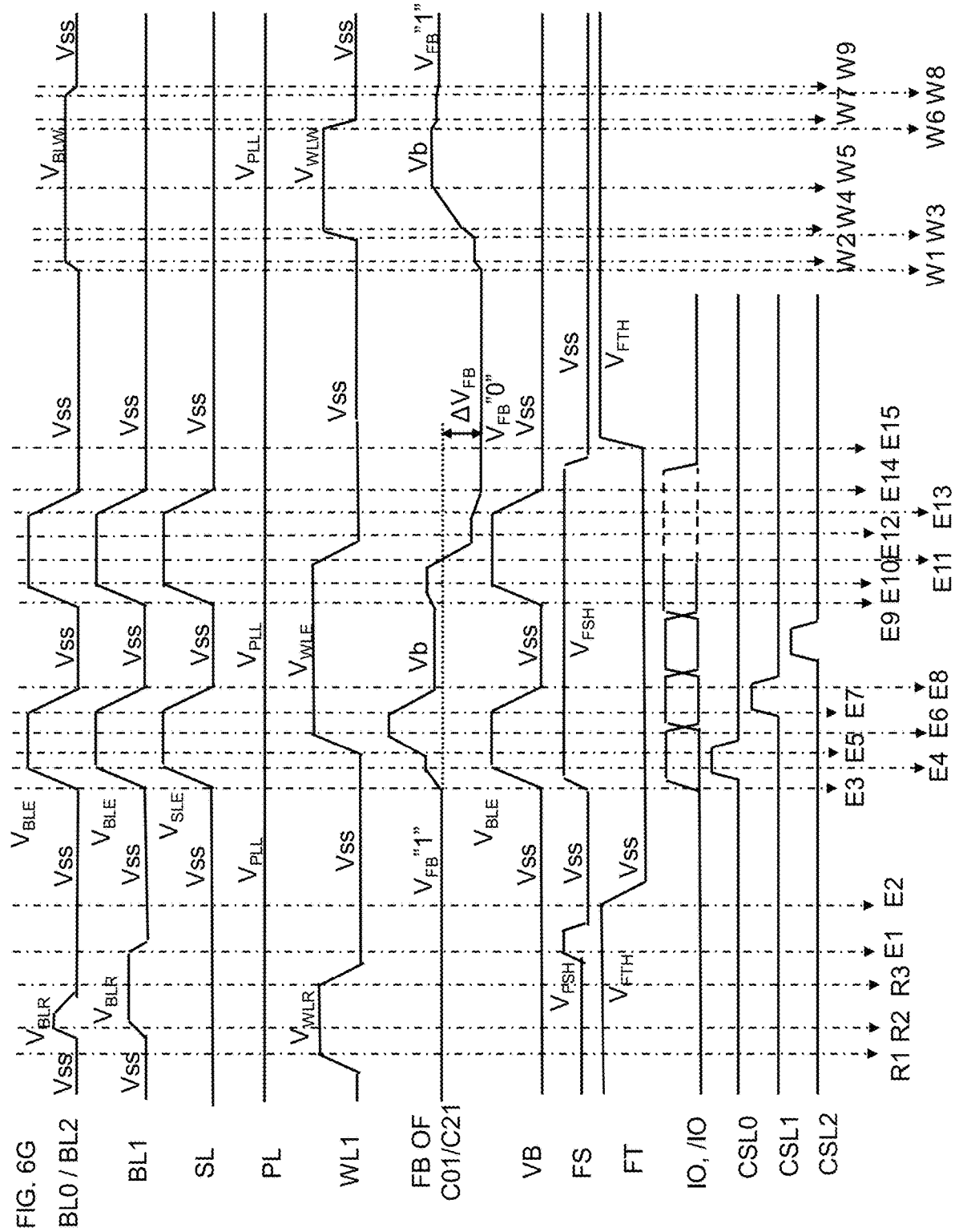

$$C_{FB} = C_{WL} + C_{BL} + C_{SL} \quad (10)$$

$$\beta_{WL} = \frac{C_{WL}}{C_{WL} + C_{BL} + C_{SL}} \quad (11)$$

$$\Delta V_{FB} = V_{FB2} - V_{FB1}$$
$$= \beta_{WL} \times V_{WLH} \quad (12)$$

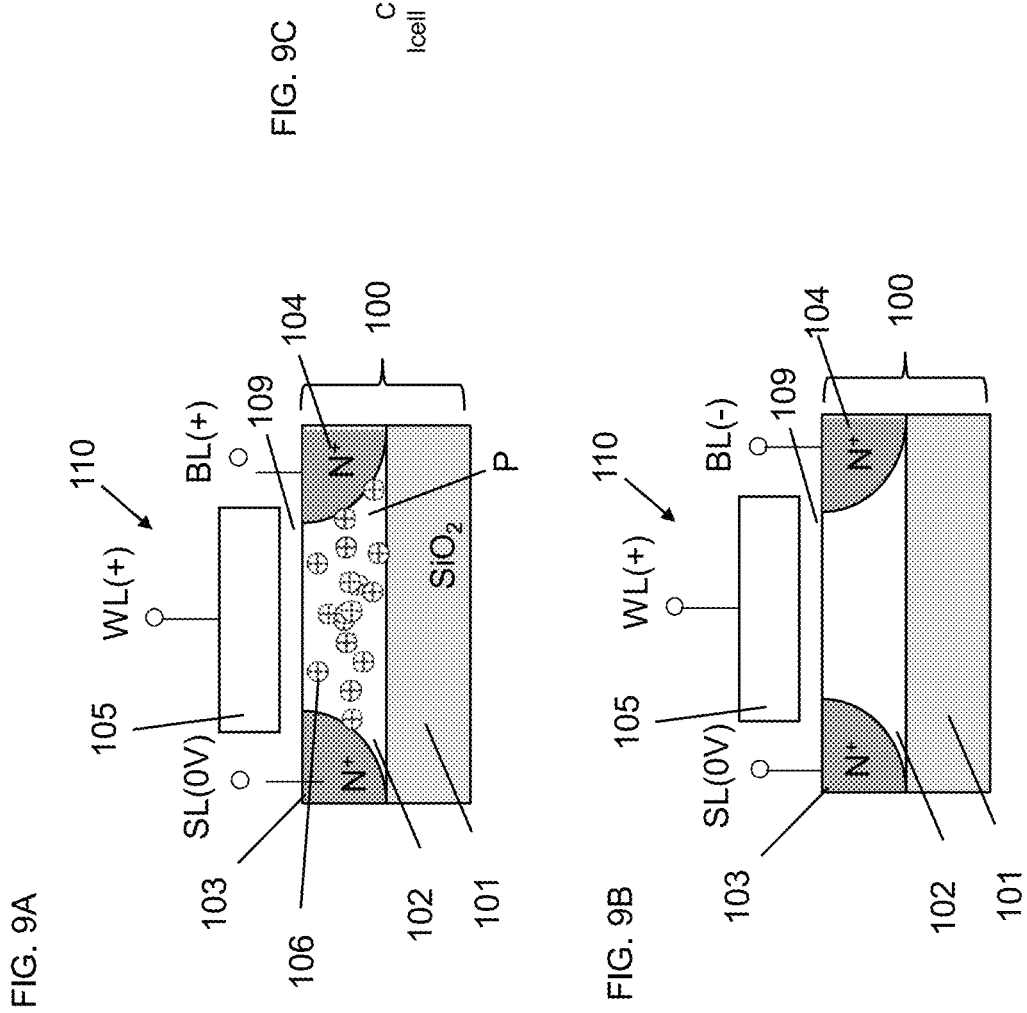

MEMORY APPARATUS USING SEMICONDUCTOR DEVICES

CROSS-REFERENCE TO RELATED APPLICATIONS

This application claims priority to PCT/JP2021/017352 filed May 6, 2021, the enter content of which is incorporated herein by reference.

TECHNICAL FIELD

The present invention relates to a memory apparatus using semiconductor devices.

BACKGROUND ART

In recent years, a higher degree of integration and higher performance of memory devices have been demanded in the development of the LSI (Large Scale Integration) technology.

In a common planar MOS transistor, a channel extends in the horizontal direction along the upper surface of a semiconductor substrate. In contrast, a channel of a SGT extends in a direction perpendicular to the upper surface of a semiconductor substrate (for example, see Patent Literature 1 and Non Patent Literature 1). Therefore, when SGTs are used, the density of a semiconductor apparatus can be increased more than when planar MOS transistors are used. Using such SGTs as selection transistors can achieve a high degree of integration of, for example, DRAM (Dynamic Random Access Memory) with a capacitor connected thereto (for example, see Non Patent Literature 2), PCM (Phase Change Memory) with a variable resistance element connected thereto (for example, see Non Patent Literature 3), RRAM (Resistive Random Access Memory; for example, see Non Patent Literature 4), and MRAM (Magneto-resistive Random Access Memory) whose resistance is changed by changing the direction of a magnetic spin using a current (for example, see Non Patent Literature 5). There is also known a capacitorless DRAM memory cell including a single MOS transistor (see Non Patent Literature 7), for example. The present application relates to dynamic flash memory that can be formed with only a MOS transistor and without a variable resistance element or a capacitor.

FIGS. 7A to 7D illustrate a write operation for the aforementioned capacitorless DRAM memory cell including a single MOS transistor, FIGS. 8A and 8B illustrate problems with the operation thereof, and FIGS. 9A to 9C illustrate a read operation (see Non Patent Literatures 7 to 10). FIG. 7A illustrates a "1" written state. Herein, the memory cell includes a source $N^+$ layer 103 (hereinafter, a semiconductor region containing a high concentration of donor impurities shall be referred to as an "$N^+$ layer") connecting to a source line SL and a drain $N^+$ layer 104 connecting to a bit line BL, each formed in a SOI substrate 100; a gate conductive layer 105 connecting to a word line WL; and a floating body 102 of a MOS transistor 110. The DRAM memory cell does not include a capacitor, and is formed with a single MOS transistor 110. It should be noted that the floating body 102 is in contact with a $SiO_2$ layer 101 of the SOI substrate immediately below the floating body 102. When "1" is written to such a memory cell including a single MOS transistor 110, the MOS transistor 110 is operated in the saturation region. That is, a channel 107 for electrons extending from the source $N^+$ layer 103 has a pinch-off point 108, and thus does not reach the drain $N^+$ layer 104 connecting to the bit line. When the MOS transistor 110 is operated while each of the bit line BL connected to the drain $N^+$ layer and the word line WL connected to the gate conductive layer 105 is set at a high voltage and the gate voltage is set at a level of about ½ that of the drain voltage, the intensity of an electric field becomes maximum at the pinch-off point 108 around the drain $N^+$ layer 104. Consequently, accelerated electrons flowing from the source $N^+$ layer 103 to the drain $N^+$ layer 104 collide with Si lattices, and electron-hole pairs are generated due to the kinetic energy lost during the collision (i.e., an impact ionization phenomenon). Most of the generated electrons (not illustrated) reach the drain $N^+$ layer 104. Meanwhile, only some of the electrons that are very hot reach the gate conductive layer 105 beyond a gate oxide film 109. In addition, holes 106 generated at the same time charge the floating body 102. In such a case, since the floating body 102 is p-type Si, the generated holes contribute to increasing the majority carriers. When the floating body 102 is filled with the generated holes 106 and the voltage of the floating body 102 becomes higher than that of the source $N^+$ layer 103, specifically, Vb or greater, the generated holes are further released to the source $N^+$ layer 103. Herein, Vb is the built-in voltage of a P-N junction between the source $N^+$ layer 103 and the floating body 102 as the P-layer, and is about 0.7 V. FIG. 7B illustrates a view in which the floating body 102 is saturated with and charged with the generated holes 106.

Next, an operation of writing "0" to the memory cell 110 will be described with reference to FIG. 7C. With respect to a common selected word line WL, there randomly exist memory cells 110 to which "1" is written and memory cells 110 to which "0" is written. FIG. 7C illustrates a view in which the state of the memory cell 110 changes from the "1" written state to the "0" written state. When "0" is written, the bit line BL is set at a negative bias voltage so that a P-N junction between the drain $N^+$ layer 104 and the floating body 102 as the P-layer is forward-biased. Consequently, the holes 106, which have been generated in the floating body 102 in advance in the previous cycle, flow to the drain $N^+$ layer 104 connected to the bit line BL. When the write operation is complete, two states of the memory cells are obtained that include the memory cells 110 filled with the generated holes 106 (FIG. 7B) and the memory cells 110 from which the generated holes have been discharged (FIG. 7C). The potential of the floating body 102 in the memory cell 110 filled with the holes 106 is higher than that of the floating body 102 without holes generated therein. Thus, the threshold voltage of the memory cell 110 to which "1" is written is lower than the threshold voltage of the memory cell 110 to which "0" is written. FIG. 7D illustrates such a state.

Next, problems with the operation of such a memory cell including a single MOS transistor 110 will be described with reference to FIGS. 8A and 8B. As illustrated in FIG. 8A, the capacitance $C_{FB}$ of the floating body is equal to the sum of the capacitance $C_{WL}$ between the gate connecting to the word line and the floating body, the junction capacitance $C_{SL}$ of the P-N junction between the source $N^+$ layer 103 connecting to the source line and the floating body 102, and the junction capacitance $C_{BL}$ of the P-N junction between the drain $N^+$ layer 104 connecting to the bit line and the floating body 102, and is represented as follows.

$$C_{FB}=C_{WL}+C_{BL}+C_{SL} \tag{10}$$

In addition, the capacitive coupling ratio $\beta_{WL}$ between the gate connecting to the word line and the floating body is represented as follows.

$$\beta_{WL}=C_{WL}/(C_{WL}+C_{BL}+C_{SL}) \tag{11}$$

Thus, when the voltage $V_{WL}$ of the word line oscillates during reading or writing, the voltage of the floating body 102 as a storage node (i.e., a node) of the memory cell is also influenced. FIG. 8B illustrates such a state. When the voltage VWL of the word line changes from 0 V to $V_{WLH}$ during reading or writing, the voltage $V_{FB}$ of the floating body 102 rises from the voltage $V_{FB1}$ in the initial state before the voltage of the word line has changed to $V_{FB2}$ due to capacitive coupling with the word line. The amount of change in the voltage $\Delta V_{FB}$ is represented as follows.

$$\Delta V_{FB} = V_{FB2} - V_{FB1} = \beta_{WL} \times V_{WLH} \tag{12}$$

Herein, regarding $\beta_{WL}$ in Expression (11), the contribution rate of $C_{WL}$ is large, and, for example, $C_{WL}:C_{BL}:C_{SL}=8:1:1$. In such a case, $\beta_{WL}=0.8$. When the voltage of the word line has changed from 5 V during writing to 0 V at the completion of the writing, for example, the floating body 102 receives oscillation noise with 5 V×$\beta_{WL}$=4 V due to the capacitive coupling between the word line WL and the floating body 102. Therefore, there has been a problem in that a sufficient margin cannot be provided for the potential difference between the potentials of the floating body 102 when "1" is written thereto and "0" is written thereto.

FIGS. 9A to 9C illustrate a read operation; specifically, FIG. 9A illustrates a "1" written state and FIG. 9B illustrates a "0" written state. However, in practice, even when Vb has been written to the floating body 102 during writing of "1," the floating body 102 is negative-biased once the voltage of the word line returns to 0 V at the completion of the writing. When "0" is written, the floating body 102 is negative-biased further deeply. Thus, as illustrated in FIG. 9C, it would be impossible to provide a sufficient margin for the potential difference between when "1" is written and when "0" is written. Thus, it has been practically difficult to commercialize capacitorless DRAM memory cells.

CITATION LIST

Patent Literature

[Patent Literature 1] Japanese Patent Laid-Open No. 2-188966
[Patent Literature 2] Japanese Patent Laid-Open No. 3-171768
[Patent Literature 3] Japanese Patent No. 3957774

Non Patent Literature

[Non Patent Literature 1] Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol.38, No.3, pp.573-578 (1991)
[Non Patent Literature 2] H. Chung, H. Kim, H. Kim, K. Kim, S. Kim, K. Dong, J. Kim, Y.C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)
[Non Patent Literature 3] H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol.98, No 12, December, pp.2201-2227 (2010)
[Non Patent Literature 4] T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3 V," IEDM (2007)
[Non Patent Literature 5] W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp.1-9 (2015)
[Non Patent Literature 6] M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No.5, pp.405-407 (2010)
[Non Patent Literature 7] J. Wan, L. Rojer, A. Zaslaysky, and S. Critoloveanu: "A Compact Capacitor-Less High-Speed DRAM Using Field Effect-Controlled Charge Regeneration," Electron Device Letters, Vol. 35, No.2, pp.179-181 (2012)
[Non Patent Literature 8] T. Ohsawa, K. Fujita, T. Higashi, Y. Iwata, T. Kajiyama, Y. Asao, and K. Sunouchi: "Memory design using a one-transistor gain cell on SOI," IEEE JSSC, vol.37, No.11, pp1510-1522 (2002).
[Non Patent Literature 9] T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006).
[Non Patent Literature 10] E. Yoshida, T. Tanaka: "A Design of a Capacitorless 1T-DRAM Cell Using Gate-induced Drain Leakage (GIDL) Current for Low-power and High-speed Embedded Memory," IEEE IEDM (2003).
[Non Patent Literature 11] J. Y. Song, W. Y. Choi, J. H. Park, J. D. Lee, and B-G. Park: "Design Optimization of Gate-All-Around (GAA) MOSFETs," IEEE Trans. Electron Devices, vol. 5, no. 3, pp.186-191, May 2006.
[Non Patent Literature 12] N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, June 2017.
[Non Patent Literature 13] H. Jiang, N. Xu, B. Chen, L. Zeng1, Y. He, G. Du, X. Liu and X. Zhang: "Experimental investigation of self-heating effect (SHE) in multiple-fin SOI FinFETs," Semicond. Sci. Technol. 29 (2014) 115021 (7pp).
[Non Patent Literature 14] E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-697, April 2006.

SUMMARY OF INVENTION

Technical Problem

A capacitorless single-transistor DRAM (i.e., a gain cell) involves strong capacitive coupling between a word line and a floating body, and thus has a problem in that when the potential of the word line is oscillated during data reading or data writing, the oscillation is directly transmitted as noise to the floating body. Consequently, problems, such as erroneous reading and erroneous rewriting of memory data, occur, making it difficult to put the capacitorless single-transistor DRAM (i.e., the gain cell) into practical use.

Solution to Problem

To solve the aforementioned problems, the present invention provides a memory apparatus including a plurality of memory cells arranged in a row direction on a substrate to form a plurality of pages, the pages being arranged in a column direction, in which:

each memory cell included in each of the plurality of pages includes
- a semiconductor base material provided on the substrate in a manner standing in an upright position along a vertical direction or extending in a horizontal direction with respect to the substrate,
- a first impurity layer and a second impurity layer at opposite ends of the semiconductor base material,
- a first gate insulating layer partially or entirely surrounding a side face of the semiconductor base material between the first impurity layer and the second impurity layer, the first gate insulating layer being in contact with or located in proximity to the first impurity layer,
- a second gate insulating layer surrounding the side face of the semiconductor base material, the second gate insulating layer being continuous with the first gate insulating layer and being in contact with or located in proximity to the second impurity layer,
- a first gate conductor layer partially or entirely covering the first gate insulating layer,
- a second gate conductor layer covering the second gate insulating layer, and
- a channel semiconductor layer of the semiconductor base material covered with the first gate insulating layer and the second gate insulating layer,
- a voltage applied to each of the first gate conductor layer, the second gate conductor layer, the first impurity layer, and the second impurity layer is controlled to perform a page write operation or a page erase operation, the first impurity layer in the memory cell connects to a source line, the second impurity layer connects to a bit line, one of the first gate conductor layer and the second gate conductor layer connects to a word line, and another of the first gate conductor layer and the second gate conductor layer connects to a first drive control line, the bit line connects to a sense amplifier circuit via a switch circuit, during a page read operation, page data in a group of memory cells selected by the word line is read by the sense amplifier circuit, and during each of the page write operation, the page erase operation, and the page read operation, an identical fixed voltage is applied to the first drive control line (first invention).

In the aforementioned first invention, during the page erase operation, a pulse voltage identical to a pulse voltage of the bit line is applied to the source line in synchronism with the bit line (second invention).

In the aforementioned first invention, during the page erase operation, the switch circuit is turned off to non-conductive state, and the page data stored in the sense amplifier circuit is read (third invention).

In the aforementioned first invention, the page data stored in the sense amplifier circuit is memory data read from a memory cell before the page erase operation is started (fourth invention).

In the aforementioned first invention, the first drive control line is provided in common to at least two of the pages (fifth invention).

In the aforementioned first invention, the source line is provided in common to at least two of the pages (sixth invention).

In the aforementioned first invention, a first gate capacitance between the first gate conductor layer and the channel semiconductor layer is larger than a second gate capacitance between the second gate conductor layer and the channel semiconductor layer (seventh invention).

The first gate conductor layer is separated into two conductor layers while surrounding the first gate insulating layer as seen in plan view (eighth invention).

In the aforementioned first invention, during the page write operation, holes generated through an impact ionization phenomenon are retained in the channel semiconductor layer, and a voltage of the channel semiconductor layer is set to a first data retention voltage that is higher than one or both of a voltage of the first impurity layer and a voltage of the second impurity layer, and during the page erase operation, a voltage applied to each of the first impurity layer, the second impurity layer, the first gate conductor layer, and the second gate conductor layer is controlled so that the holes are pulled out from one or both of the first impurity layer and the second impurity layer, and the voltage of the channel semiconductor layer is set to a second data retention voltage that is lower than the first data retention voltage (ninth invention).

BRIEF DESCRIPTION OF DRAWINGS

FIGS. 3AA, 3AB and 3AC are views for illustrating the mechanism of a write operation for the memory apparatus including the SGTs according to the first embodiment.

FIGS. 4BA, 4BB, 4BC and 4BD are views for illustrating the mechanism of a page erase operation for the memory apparatus including the SGTs according to the first embodiment.

FIGS. 4DA, 4DB, 4DC and 4DD are views for illustrating the mechanism of a page erase operation for the memory apparatus including the SGTs according to the first embodiment.

FIGS. 4EA, 4EB, 4EC and 4ED are views for illustrating the mechanism of a page erase operation for the memory apparatus including the SGTs according to the first embodiment.

FIG. 6G is an operation waveform chart for illustrating that an identical fixed voltage is applied to the first drive control line during each of a page write operation, a page erase operation, and a page read operation for the memory apparatus including the SGTs according to the first embodiment.

FIGS. 9A, 9B, and 9C are views for illustrating a read operation for the conventional capacitorless DRAM memory cell.

MODE FOR CARRYING OUT THE INVENTION

Hereinafter, embodiments of a memory apparatus using semiconductor devices (hereinafter referred to as dynamic flash memory) according to the present invention will be described with reference to the drawings.

First Embodiment

The structure and operation mechanism of a dynamic flash memory cell according to a first embodiment of the present invention will be described with reference to FIGS. 1 to 5C. The structure of the dynamic flash memory cell will be described with reference to FIG. 1. Then, the effects obtained when the gate capacitance of a first gate conductor layer 5a connected to a plate line PL is set larger than the gate capacitance of a second gate conductor layer 5b connected to a word line WL will be described with reference to FIGS. 2A to 2C. Then, the mechanism of a data write operation will be described with reference to FIGS. 3AA to 3B, the mechanism of a data erase operation will be described with reference to FIGS. 4A to 4ED, and the mechanism of a data read operation will be described with reference to FIGS. 5A to 5C.

Figure 1:
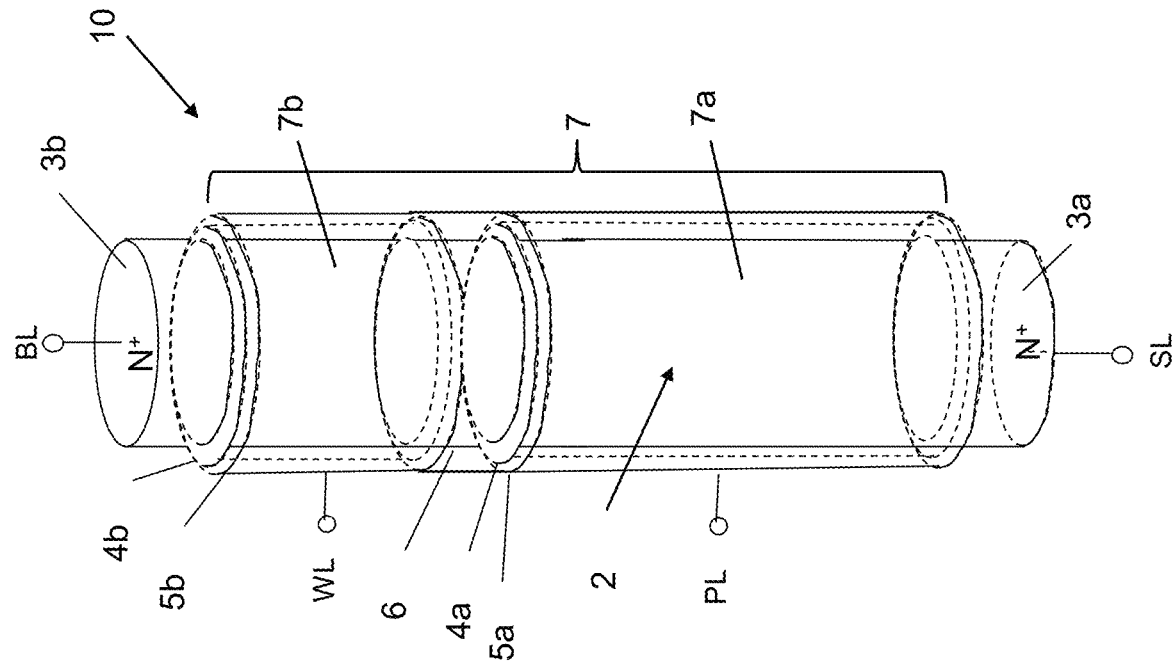
FIG. 1 is a view illustrating the structure of a memory apparatus including SGTs according to a first embodiment.

FIG. 1 illustrates the structure of the dynamic flash memory cell according to the first embodiment of the present invention. $N^+$ layers 3a and 3b (which are examples of a "first impurity layer" and a "second impurity layer" in the claims), one of which serves as a source and the other of which serves as a drain, are formed at positions above and below a silicon semiconductor pillar 2 (hereinafter, the silicon semiconductor pillar shall be referred to as a "Si pillar") with p-type or i-type (intrinsic) conductivity (which is an example of a "semiconductor base material" in the claims) formed on a substrate. The portion of the Si pillar 2 between the $N^+$ layers 3a and 3b serving as the source and the drain is a channel region 7 (which is an example of a "channel semiconductor layer" in the claims). A first gate insulating layer 4a (which is an example of a "first gate insulating layer" in the claims) and a second gate insulating layer 4b (which is an example of a "second gate insulating layer" in the claims) are formed so as to surround the channel region 7. The first gate insulating layer 4a and the second gate insulating layer 4b are respectively in contact with or located in proximity to the $N^+$ layers 3a and 3b serving as the source and the drain. A first gate conductor layer 5a (which is an example of a "first gate conductor layer " in the claims) and a second gate conductor layer 5b (which is an example of a "second gate conductor layer" in the claims) are respectively formed so as to surround the first gate insulating layer 4a and the second gate insulating layer 4b. The first gate conductor layer 5a and the second gate conductor layer 5b are separated by an insulating layer 6 (which is an example of a "first insulating layer" in the claims). The channel region 7 between the $N^+$ layers 3a and 3b includes a first channel Si layer 7a (which is an example of a "first channel semiconductor layer" in the claims) surrounded by the first gate insulating layer 4a, and a second channel Si layer 7b (which is an example of a "second channel semiconductor layer" in the claims) surrounded by the second gate insulating layer 4b. Accordingly, a dynamic flash memory cell 10 is formed that includes the $N^+$ layers 3a and 3b serving as the source and the drain, the channel region 7, the first gate insulating layer 4a, the second gate insulating layer 4b, the first gate conductor layer 5a, and the second gate conductor layer 5b. The $N^+$ layer 3a serving as the source connects to a source line SL (which is an example of a "source line" in the claims), the $N^+$ layer 3b serving as the drain connects to a bit line BL (which is an example of a "bit line" in the claims), the first gate conductor layer 5a connects to a plate line PL (which is an example of a "first drive control line" in the claims), and the second gate conductor layer 5b connects to a word line WL (which is an example of a "word line" in the claims). The dynamic flash memory cell 10 desirably has such a structure that the gate capacitance of the first gate conductor layer 5a connecting to the plate line PL is larger than the gate capacitance of the second gate conductor layer 5b connecting to the word line WL.

It should be noted that in FIG. 1, the gate length of the first gate conductor layer 5a is set longer than the gate length of the second gate conductor layer 5b such that the gate capacitance of the first gate conductor layer 5a connected to the plate line PL becomes larger than the gate capacitance of the second gate conductor layer 5b connected to the word line WL. However, it is also possible to, without setting the gate length of the first gate conductor layer 5a to be longer than the gate length of the second gate conductor layer 5b, vary the thicknesses of the two gate insulating layers such that the thickness of the gate insulating film for the first gate insulating layer 4a becomes thinner than the thickness of the gate insulating film for the second gate insulating layer 4b. Alternatively, it is also possible to vary the dielectric constants of the materials of the two gate insulating layers such that the dielectric constant of the gate insulating film for the first gate insulating layer 4a becomes higher than the dielectric constant of the gate insulating film for the second gate insulating layer 4b. As a further alternative, it is also possible to combine any of the lengths of the gate conductor layers 5a and 5b and the thicknesses and dielectric constants of the gate insulating layers 4a and 4b so that the gate capacitance of the first gate conductor layer 5a connected to the plate line PL becomes larger than the gate capacitance of the second gate conductor layer 5b connected to the word line WL.

Figure 2A:
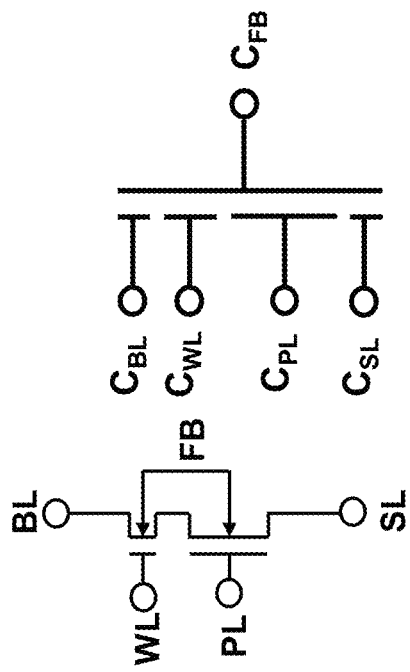
FIGS. 2A, 2B and 2C are views illustrating the effects obtained when the gate capacitance of a first gate conductor layer 5a connected to a plate line PL is set larger than the gate capacitance of a second gate conductor layer 5b connected to a word line WL in the memory apparatus including the SGTs according to the first embodiment.
Figure 2B:
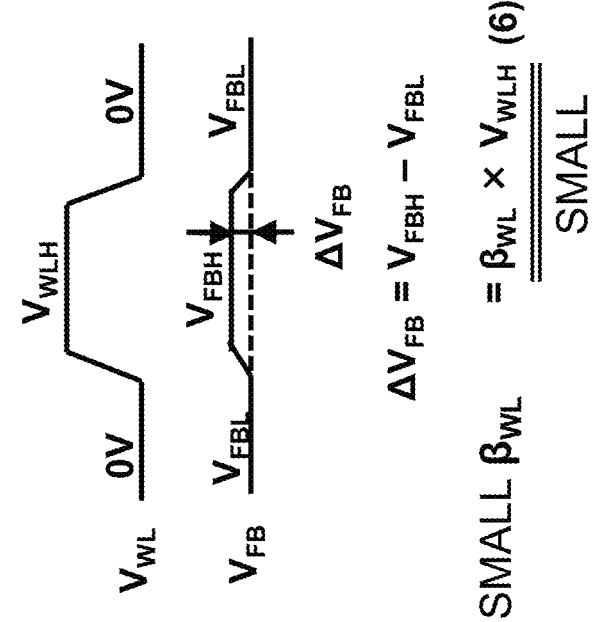
Figure 2C:
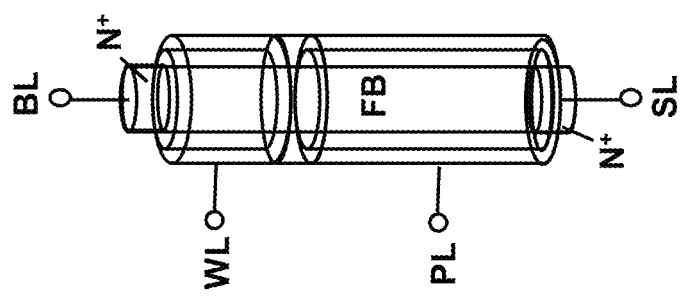

FIGS. 2A to 2C are views illustrating the effects obtained when the gate capacitance of the first gate conductor layer 5a connected to the plate line PL is set larger than the gate capacitance of the second gate conductor layer 5b connected to the word line WL.

FIG. 2A schematically illustrates only the main portion of the structure of the dynamic flash memory cell according to the first embodiment of the present invention. The bit line BL, the word line WL, the plate line PL, and the source line SL are connected to the dynamic flash memory cell, and the potential state of the channel region 7 is determined by their voltage states.

FIG. 2B is a view for illustrating the relationship between their capacitances. The capacitance $C_{FB}$ of the channel region 7 is equal to the sum of the capacitance $C_{WL}$ between the gate conductor layer 5b connecting to the word line WL and the channel region 7, the capacitance $C_{PL}$ between the gate conductor layer 5a connecting to the plate line PL and the channel region 7, the junction capacitance $C_{SL}$ of a P-N junction between the source $N^+$ layer 3a connecting to the source line SL and the channel region 7, and the junction capacitance $C_{BL}$ of a P-N junction between the drain $N^+$ layer 3b connecting to the bit line BL and the channel region 7, and is represented as follows.

$$C_{FB}=C_{WL}+C_{PL}+C_{BL}+C_{SL} \quad (1).$$

Thus, the coupling ratio $\beta_{WL}$ between the word line WL and the channel region 7, the coupling ratio $\beta_{PL}$ between the plate line PL and the channel region 7, the coupling ratio $\beta_{BL}$ between the bit line BL and the channel region 7, and the coupling ratio $\beta_{SL}$ the between the source line SL and the channel region 7 are represented as follows.

$$\beta_{WL}=C_{WL}/(C_{WL}+C_{PL}+C_{BL}+C_{SL}) \quad (2)$$

$$\beta_{PL}=C_{PL}/(C_{WL}+C_{PL}+C_{BL}+C_{SL}) \quad (3)$$

$$\beta_{BL}=C_{BL}/(C_{WL}+C_{PL}+C_{BL}+C_{SL}) \quad (4)$$

$$\beta_{SL}=C_{SL}/(C_{WL}+C_{PL}+C_{BL}+C_{SL}) \quad (5)$$

Herein, since $C_{PL}>C_{WL}$, $\beta_{PL}>\beta_{WL}$.

FIG. 2C is a view for illustrating changes in the voltage $V_{FB}$ of the channel region 7 when the voltage $V_{WL}$ of the word line WL rises and then drops during a read operation or a write operation. Herein, the potential difference $\Delta V_{FB}$ when the voltage $V_{FB}$ of the channel region 7 changes from a low voltage state $V_{FBL}$ to a high voltage state $V_{FBH}$ as the voltage $V_{WL}$ of the word line WL rises from 0 V to a high voltage state $V_{WLH}$ is as follows.

$$\Delta V_{FB} = V_{FBH} - V_{FBL} = \beta_{WL} \times V_{WLH} \quad (6)$$

Since the coupling ratio $\beta_{WL}$ between the word line WL and the channel region 7 is small and the coupling ratio $\beta_{PL}$ between the plate line PL and the channel region 7 is large, $\Delta V_{FB}$ is small. Thus, even when the voltage $V_{WL}$ of the word line WL oscillates up and down during a read operation or a write operation, the voltage $V_{FB}$ of the channel region 7 hardly changes.

FIGS. 3AA to 3AC and 3B illustrates a memory write operation (which is an example of a "memory write operation" in the claims) for the dynamic flash memory cell according to the first embodiment of the present invention. FIG. 3AA illustrates the mechanism of the write operation, and FIG. 3AB illustrates the operation waveforms of the bit line BL, the source line SL, the plate line PL, the word line WL, and the channel region 7 functioning as a floating body FB. At a time T0, the dynamic flash memory cell is in a "0" erase state and the voltage of the channel region 7 is $V_{FB}$ "0." In addition, Vss is applied to each of the bit line BL, the source line SL, and the word line WL, and $V_{PLL}$ is applied to the plate line PL. Herein Vss is 0 V and $V_{PLL}$ is 2 V, for example. Next, at times T1 to T2, when the voltage of the bit line BL rises from Vss to $V_{BLH}$, if Vss is 0 V, for example, the voltage of the channel region 7 becomes $V_{FB}$ "0"+$\beta_{BL}\times V_{BLH}$ due to the capacitive coupling between the bit line BL and the channel region 7.

Next, the description of the write operation for the dynamic flash memory cell will be continued with reference to FIGS. 3AA and 3AB. At times T3 to T4, the voltage of the word line WL rises from Vss to $V_{WLH}$. Accordingly, provided that the "0" erase threshold voltage of a second N-channel MOS transistor region in the channel region 7 surrounded by the second gate conductor layer 5b connecting to the word line WL is $Vt_{WL}$ "0," the voltage of the channel region 7 becomes $V_{FB}$ "0"+$\beta_{BL}\times V_{BLH}$+$\beta_{WL}\times Vt_{WL}$ "0" in the range of Vss to $Vt_{WL}$ "0" due to a second capacitive coupling between the word line WL and the channel region 7 as the voltage of the word line WL rises. When the voltage of the word line WL has risen to $Vt_{WL}$ "0" or greater, an annular inversion layer 12b is formed in the channel region 7 on the inner periphery of the second gate conductor layer 5b, which blocks the second capacitive coupling between the word line WL and the channel region 7.

Next, the description of the write operation for the dynamic flash memory cell will be continued with reference to FIGS. 3AA and 3AB. At the times T3 to T4, $V_{PLL}$=2 V, for example, is fixedly input to the first gate conductor layer 5a connecting to the plate line PL, and the voltage of the second gate conductor layer 5b connecting to the word line WL is increased to $V_{WLH}$=4 V, for example. Consequently, as illustrated in FIG. 3AA, an annular inversion layer 12a is formed in the channel region 7 on the inner periphery of the first gate conductor layer 5a connecting to the plate line PL, and the inversion layer 12a has a pinch-off point 13. Thus, a first N-channel MOS transistor region having the first gate conductor layer 5a operates in the saturation region. Meanwhile, the second N-channel MOS transistor region having the second gate conductor layer 5b connecting to the word line WL operates in the linear region. Thus, there is no pinch-off point in the channel region 7 on the inner periphery of the second gate conductor layer 5b connecting to the word line WL, and the inversion layer 12b is formed on the entire surface of the inner periphery of the gate conductor layer 5b. The inversion layer 12b formed on the entire surface of the inner periphery of the second gate conductor layer 5b connecting to the word line WL functions as a substantial drain of the second N-channel MOS transistor region having the second gate conductor layer 5b. Thus, an electric field in a first boundary region of the channel region 7 between the first N-channel MOS transistor region having the first gate conductor layer 5a and the second N-channel MOS transistor region having the second gate conductor layer 5b, which are connected in series, becomes maximum, and an impact ionization phenomenon occurs in the region. Such a region is a region on the source side as seen from the second N-channel MOS transistor region having the second gate conductor layer 5b connecting to the word line WL. Thus, such a phenomenon is called a source-side impact ionization phenomenon. Due to the source-side impact ionization phenomenon, electrons flow from the N$^+$ layer 3a connecting to the source line SL to the N$^+$ layer 3b connecting to the bit line. The accelerated electrons collide with Si lattice atoms, and electron-hole pairs are generated due to the kinetic energy. Some of the generated electrons flow into the first gate conductor layer 5a and the second gate conductor layer 5b, but most of them flow into the N$^+$ layer 3b connecting to the bit line BL (not illustrated).

As illustrated in FIG. 3AC, the generated holes 9 (which are examples of "holes" in the claims) are the majority carriers in the channel region 7, and charge the channel region 7 in a positively biased manner. Since the N$^+$ layer 3a connecting to the source line SL is at 0 V, the channel region 7 is charged up to the built-in voltage Vb (about 0.7 V) of the P-N junction between the N$^+$ layer 3a connecting to the source line SL and the channel region 7. When the channel region 7 is charged in a positively biased manner, the threshold voltage of each of the first N-channel MOS transistor region and the second N-channel MOS transistor region becomes lower due to the substrate bias effect.

Next, the description of the write operation for the dynamic flash memory cell will be continued with reference to FIG. 3AB. At times T6 to T7, the voltage of the word line WL drops from $V_{WLH}$ to Vss. At this time, the second capacitive coupling occurs between the word line WL and the channel region 7, but until the voltage $V_{WLH}$ of the word line WL becomes less than or equal to the threshold voltage $Vt_{WL}$ "1" of the second N-channel MOS transistor region when the voltage of the channel region 7 is Vb, the inversion layer 12b blocks the second capacitive coupling. Thus, the substantial capacitive coupling between the word line WL and the channel region 7 occurs only when the voltage of the word line WL has become less than or equal to $Vt_{WLv}$ "1" and has dropped down to Vss. Consequently, the voltage of the channel region 7 becomes Vb−$\beta_{WL}$×$Vt_{WL}$ "1." Herein, $Vt_{WL}$ "1" is lower than $Vt_{WL}$ "0," and $\beta_{WL}$×$Vt_{WL}$ "1" is small.

Next, the description of the write operation for the dynamic flash memory cell will be continued with reference to FIG. 3AB. At times T8 to T9, the voltage of the bit line BL drops from $V_{BLH}$ to Vss. Since the bit line BL and the channel region 7 are capacitively coupled, the voltage $V_{FB}$ "1" of the channel region 7 with "1" written thereto finally becomes as follows.

$$V_{FB}\text{"1"}=Vb-\beta_{WL}\times Vt_{WL}\text{"1"}\beta_{BL}\times V_{BLH} \quad (7)$$

Figure 3B:
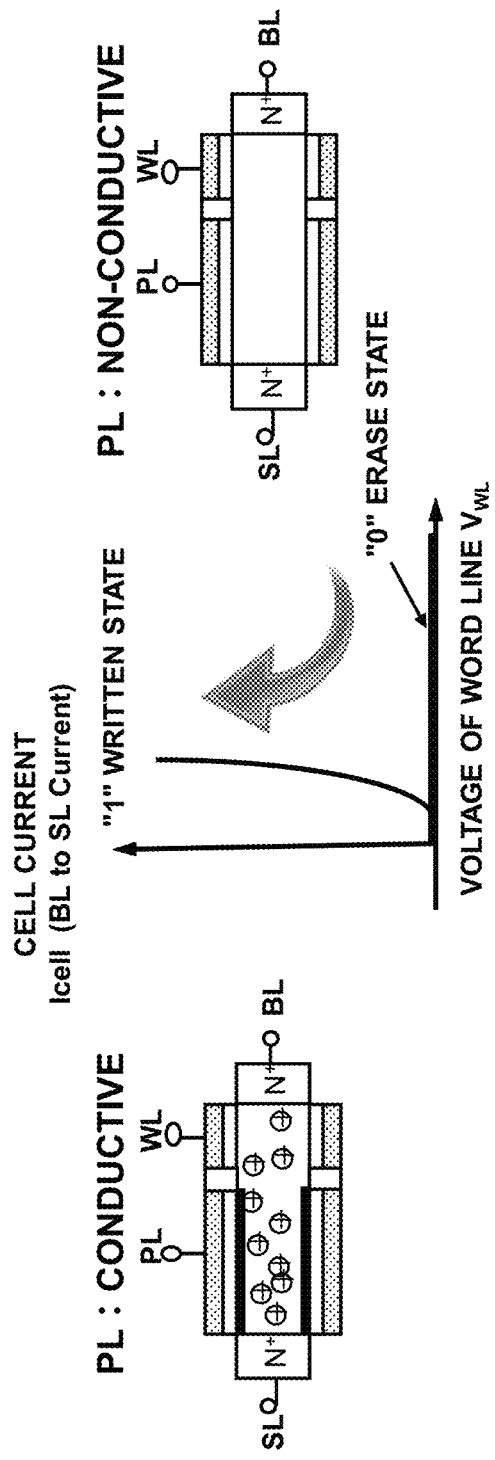
FIG. 3B is a view for illustrating the mechanism of a write operation for the memory apparatus including the SGTs according to the first embodiment.

Herein, the coupling ratio $\beta_{BL}$ between the bit line BL and the channel region 7 is also small. Accordingly, as illustrated in FIG. 3B, the threshold voltage of the second N-channel MOS transistor region in the second channel region 7b connecting to the word line WL becomes low. The memory write operation is performed by setting the voltage of the channel region 7 in the "1" written state as a first data retention voltage (which is an example of a "first data retention voltage" in the claims), and such a state is allocated as logical memory data "1."

It should be noted that during the write operation, it is also possible to generate electron-hole pairs through an impact ionization phenomenon not in the first boundary region but in a second boundary region between the first impurity layer 3a and the first channel semiconductor layer 7a or a third boundary region between the second impurity layer 3b and the second channel semiconductor layer 7b, and then charge the channel region 7 with the generated holes 9.

The mechanism of a memory erase operation (which is an example of a "memory erase operation" in the claims) will be described with reference to FIGS. 4A to 4ED.

Figure 4A:
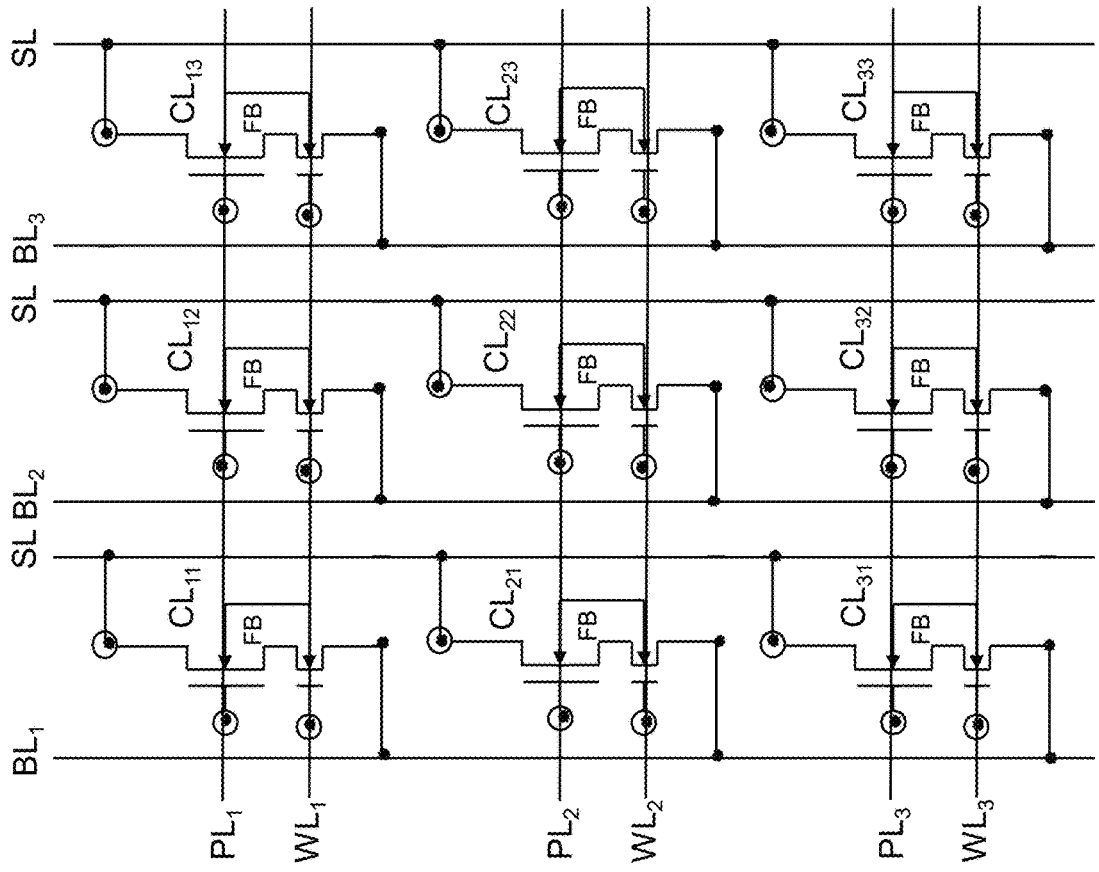
FIG. 4A is a diagram for illustrating the mechanism of a page erase operation for the memory apparatus including the SGTs according to the first embodiment.

FIG. 4A illustrates a memory block circuit diagram for illustrating a page erase operation. Herein a total of nine (3 rows×3 columns) memory cells $CL_{11}$ to $CL_{33}$ are illustrated, but the actual memory block is larger than such a matrix. When memory cells are arranged in a matrix, one of the directions of the array is referred to as a "row direction" (or "rows"), and a direction perpendicular thereto is referred to as a "column direction" (or "columns"). A source line SL, bit lines $BL_1$ to $BL_3$, plate lines $PL_1$ to $PL_3$, and word lines $WL_1$ to $WL_3$ are connected to the respective memory cells. For example, a case is considered where a page erase operation is performed by selecting memory cells $CL_{21}$ to $CL_{23}$ connecting to the plate line $PL_2$ and the word line $WL_2$ in a given page (which is an example of a "page" in the claims) of the block.

The mechanism of the page erase operation will be described with reference to FIGS. 4BA to 4BD and 4C. Herein, the channel region 7 between the N$^+$ layers 3a and 3b is electrically isolated from the substrate, and functions as a floating body. FIG. 4BA is an operation timing waveform chart of the primary nodes in the erase operation. In FIG. 4BA, T0 to T12 represent a period of times from when the erase operation starts till it ends. FIG. 4BB illustrates a state in which the holes 9 generated through impact ionization in a previous cycle are stored in the channel region 7 at the time T0 before the erase operation is started. At the times T1 to T2, the bit lines $BL_1$ to $BL_3$ and the source line SL respectively become high voltage states of $V_{BLH}$ and $V_{SLH}$ from Vss. Herein, Vss is 0 V, for example. In the next period of the times T3 to T4, the plate line $PL_2$ and the word line $WL_2$ selected in the page erase operation respectively become a high voltage state of a second voltage $V_{PLH}$ from a first voltage $V_{PLL}$ and a high voltage state of a fourth voltage $V_{WLH}$ from a third voltage Vss. Thus, neither the inversion layer 12a on the inner periphery of the first gate conductor layer 5a connecting to the plate line $PL_2$ nor the inversion layer 12b on the inner periphery of the second gate conductor layer 5b connecting to the word line $WL_2$ is formed in the channel region 7. Thus, provided that the threshold voltage of the second N-channel MOS transistor region on the side of the word line $WL_2$ is $V_{tWL}$ and the threshold voltage of the of the first N-channel MOS transistor region on the side of the plate line $PL_2$ is $V_{tPL}$, it is desirable that the voltages $V_{BLH}$ and $V_{SLH}$ satisfy $V_{BLH} > V_{WLH} + V_{tWL}$ and $V_{SLH} > V_{PLH} + V_{tPL}$. For example, when $V_{tWL}$ and $V_{tPL}$ are 0.5 V, $V_{WLH}$ and $V_{PLH}$ may be set to 3 V, and $V_{BLH}$ and $V_{SLH}$ may be set to greater than or equal to 3.5 V.

Next, the description of the mechanism of the page erase operation in FIG. 4BA will be continued. At the times T3 to T4 of a first period, as the plate line $PL_2$ and the word line $WL_2$ respectively become high voltage states of the second voltage $V_{PLH}$ and the fourth voltage $V_{WLH}$, the voltage of the channel region 7 in the floating state is boosted due to the first capacitive coupling between the plate line $PL_2$ and the channel region 7 and the second capacitive coupling between the word line $WL_2$ and the channel region 7. The voltage of the channel region 7 becomes a high voltage from $V_{FB}$ "1" in the "1" written state. This is because since the bit lines $BL_1$ to $BL_3$ and the source line SL are respectively at high voltages of $V_{BLH}$ and $V_{SLH}$, the P-N junction between the source $N^+$ layer 3a and the channel region 7 and the P-N junction between the drain $N^+$ layer 3b and the channel region 7 are reverse-biased, which allows for boosting of the voltage of the channel region 7.

Next, the description of the mechanism of the page erase operation in FIG. 4BA will be continued. At the times T5 to T6 of the next period, the voltages of the bit lines $BL_1$ to $BL_3$ and the source line SL respectively drop from the high voltages of $V_{BLH}$ and $V_{SLH}$ to Vss. Consequently, the P-N junction between the source $N^+$ layer 3a and the channel region 7 and the P-N junction between the drain $N^+$ layer 3b and the channel region 7 are forward-biased as illustrated in FIG. 4BC, and the remaining holes of the holes 9 in the channel region 7 are discharged to the source $N^+$ layer 3a and the drain $N^+$ layer 3b. Thus, the voltage VFB of the channel region 7 becomes the built-in voltage Vb of the P-N junction formed by the source $N^+$ layer 3a and the channel region 7 as the P-layer and the P-N junction formed by the drain $N^+$ layer 3b and the channel region 7 as the P-layer.

Next, the description of the mechanism of the page erase operation in FIG. 4BA will be continued. Next, at the times T7 to T8, the voltages of the bit lines $BL_1$ to $BL_3$ and the source line SL respectively rise from Vss to high voltages of $V_{BLH}$ and $V_{SLH}$. Accordingly, as illustrated in FIG. 4BD, when the voltages of the plate line $PL_2$ and the word line $WL_2$ respectively drop from the second voltage $V_{PLH}$ and the fourth voltage $V_{WLH}$ to the first voltage $V_{PLL}$ and the third voltage Vss at the times T9 to T10, neither the inversion layer 12a on the side of the plate line $PL_2$ nor the inversion layer 12b on the side of the word line $WL_2$ is formed in the channel region 7. Thus, the voltage $V_{FB}$ of the channel region 7 efficiently becomes $V_{FB}$ "0" from Vb due to the first capacitive coupling between the plate line $PL_2$ and the channel region 7 and the second capacitive coupling between the word line $WL_2$ and the channel region 7. Thus, the voltage difference $\Delta V_{FB}$ of the channel region 7 between the "1" written state and the "0" erase state is represented by the following expression.

$$V_{FB}"1" = Vb - \beta_{WL} \times Vt_{WL}"1" - \beta_{BL} \times V_{BLH} \quad (7)$$

$$V_{FB}"0" = Vb - \beta_{WL} \times V_{WLH} - \beta_{PL} \times (V_{PLH} - V_{PLL}) \quad (8)$$

$$\Delta V_{FB} = V_{FB}"1" - V_{FB}"0" = \beta_{WL} \times V_{WLH} + \beta_{PL} \times (V_{PLH} - V_{PLL})$$

$$- \beta_{WL} \times Vt_{WL}"1" - \beta_{BL} \times V_{BLH} \quad (9)$$

Herein, since the sum of $\beta_{WL}$ and $\beta_{PL}$ is greater than or equal to 0.8, $\Delta V_{FB}$ is large enough to provide a margin.

Figure 4C:
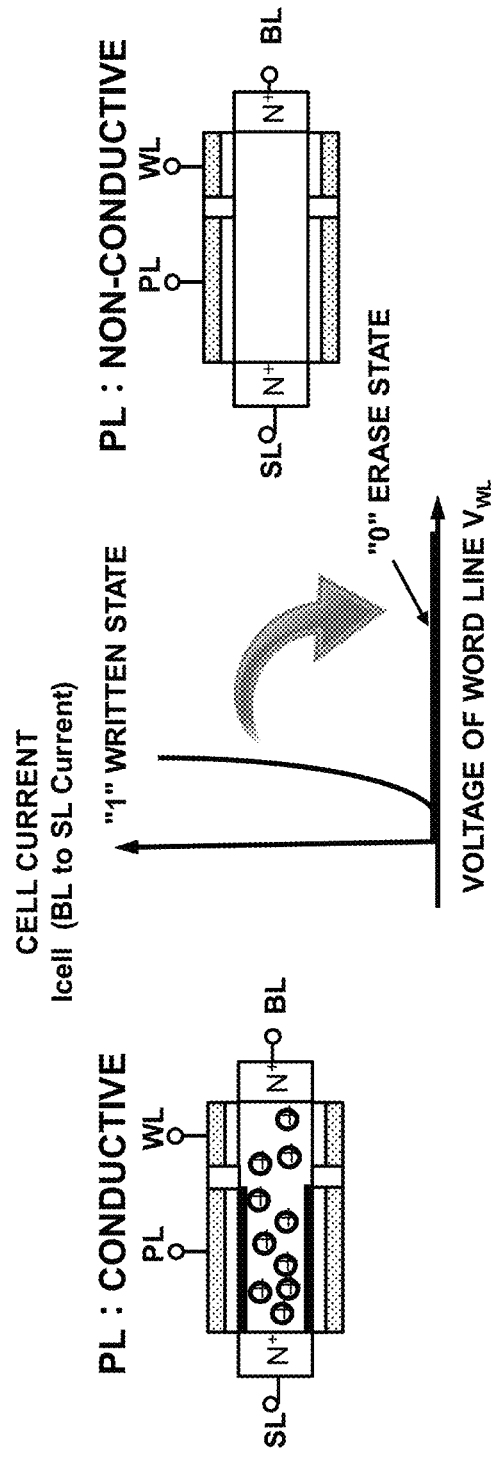
FIG. 4C is a view for illustrating the mechanism of a page erase operation for the memory apparatus including the SGTs according to the first embodiment.

Consequently, as illustrated in FIG. 4C, a large margin is provided between the "1" written state and the "0" erase state. Herein, in the "0" erase state, the threshold voltage on the side of the plate line $PL_2$ is high due to the substrate bias effect. Thus, if the voltage applied to the plate line $PL_2$ is set to less than or equal to the threshold voltage, for example, the first N-channel MOS transistor region on the side of the plate line $PL_2$ becomes non-conductive, and thus, no memory cell current flows therethrough. "PL: non-conductive" on the right side of FIG. 4C illustrates such a state.

Next, the description of the mechanism of the page erase operation in FIG. 4BA will be continued. Next, at the times T11 to T12 of a fourth period, the voltages of the bit lines $BL_1$ to $BL_3$ and the source line SL respectively drop from $V_{BLH}$ to Vss and from $V_{SLH}$ to Vss, whereby the erase operation terminates. At this time, the voltage of the channel region 7 is slightly lowered by the bit lines $BL_1$ to $BL_3$ and the source line SL due to capacitive coupling. However, since the amount of the lowered voltage is equal to the amount of the voltage of the channel region 7 increased by the bit lines $BL_1$ to $BL_3$ and the source line SL due to capacitive coupling at the times T7 to T8, the voltage rise and drop of each of the bit lines $BL_1$ to $BL_3$ and the source line SL are cancelled out, and thus have no influence on the voltage of the channel region 7. The page erase operation is performed by setting the voltage $V_{FB}$ "0" of the channel region 7 in the "0" erase state as a second data retention voltage (which is an example of a "second data retention voltage" in the claims), and such a state is allocated as logical memory data "0." When data is read, the voltage applied to the first gate conductor layer 5a connecting to the plate line PL is set higher than the threshold voltage corresponding to the logical memory data "1" and lower than the threshold voltage corresponding to the logical memory data "0." Accordingly, as illustrated in FIG. 4C, such characteristics can be obtained that no current flows even when the voltage of the word line WL is set high.

Next, the mechanism of a page erase operation will be described with reference to FIGS. 4DA to 4DD. FIGS. 4DA to 4DD differ from FIGS. 4BA to 4BD in that during the page erase operation, the bit lines $BL_1$ to $BL_3$ are set to Vss or to a floating state, and the voltage of the word line $WL_2$ is fixed to Vss. Accordingly, even when the voltage of the source line SL rises from Vss to $V_{SLH}$ at times T1 to T2, the second N-channel MOS transistor region on the side of the word line $WL_2$ does not become conductive, and thus, no memory cell current flows therethrough. Thus, there is no hole 9 generated through an impact ionization phenomenon. Other than that, as in FIGS. 4BA to 4BD, the voltage of the source line SL oscillates between Vss and $V_{SLH}$, and the voltage of the plate line $PL_2$ oscillates between $V_{PLL}$ and $V_{PLH}$. Consequently, as illustrated in FIG. 4DC, the holes 9 are discharged to the $N^+$ layer 3a as the first impurity layer connecting to the source line SL.

Next, the mechanism of a page erase operation will be described with reference to FIGS. 4EA to 4ED. FIGS. 4EA to 4ED differ from FIGS. 4BA to 4BD in that during the page erase operation, the source line SL is set to Vss or to a floating state, and the voltage of the plate line $PL_2$ is fixed to Vss. Accordingly, even when the voltages of the bit lines $BL_1$ to $BL_3$ rise from Vss to $V_{BLH}$ at times T1 to T2, the first N-channel MOS transistor region on the side of the plate line $PL_2$ does not become conductive, and thus, no memory cell current flows therethrough. Thus, there is no hole 9 generated through an impact ionization phenomenon. Other than that, as in FIGS. 4BA to 4BD, the voltages of the bit lines $BL_1$ to $BL_3$ oscillate between Vss and $V_{BLH}$, and the voltage of the word line $WL_2$ oscillates between Vss and $V_{WLH}$. Consequently, as illustrated in FIG. 4EC, the holes 9 are discharged to the N⁺ layer 3b as the second impurity layer connecting to one of the bit lines $BL_1$ to $BL_3$.

Figure 5C:
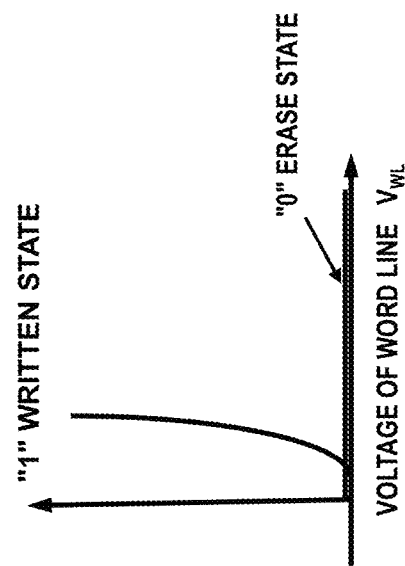
FIGS. 5A, 5B and 5C are views for illustrating the mechanism of a read operation for the memory apparatus including the SGTs according to the first embodiment.
Figure 5A:
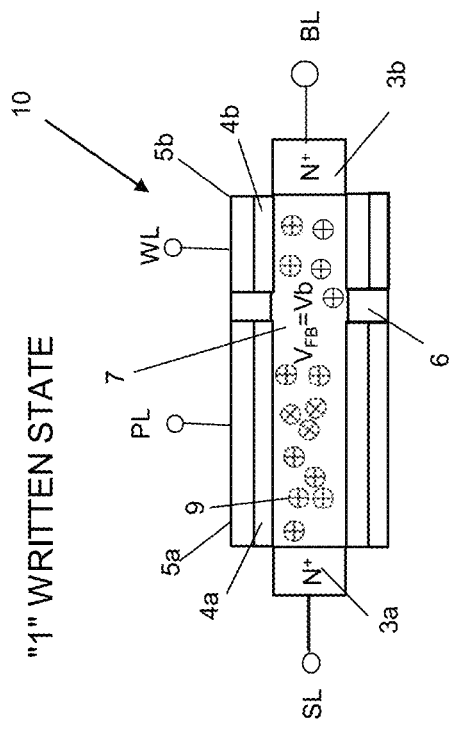
Figure 5B:
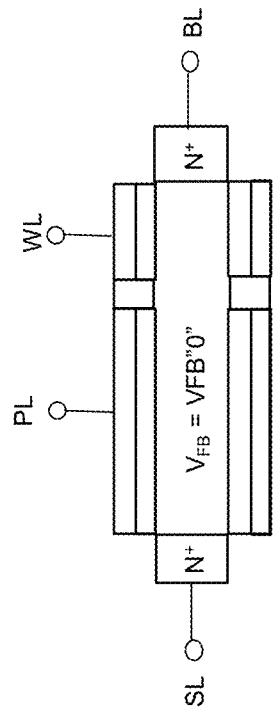

FIGS. 5A to 5C are views for illustrating a read operation for the dynamic flash memory cell according to the first embodiment of the present invention. As illustrated in FIG. 5A, when the channel region 7 is charged up to the built-in voltage Vb (about 0.7 V), the threshold voltage of the second N-channel MOS transistor region having the second gate conductor layer 5b connecting to the word line WL drops due to the substrate bias effect. Such a state is allocated as the logical memory data "1." As illustrated in FIG. 5B, a memory block selected before a write operation is performed is set to the erase state "0" in advance, and thus, the voltage $V_{FB}$ of the channel region 7 is $V_{FB}$ "0." Through a write operation, the written state "1" is randomly stored. Consequently, logical memory data at logic levels "0" and "1" are created for the word line WL. As illustrated in FIG. 5C, reading is performed with a sense amplifier by utilizing the difference in level between the two threshold voltages for the word line WL. In reading data, setting the voltage applied to the first gate conductor layer 5a connecting to the plate line PL to be higher than the threshold voltage corresponding to the logical memory data "1" and lower than the threshold voltage corresponding to the logical memory data "0" can obtain such characteristics that no current flows even when the voltage of the word line WL is set high as illustrated in FIG. 5C.

Description will be made of a fact that an identical fixed voltage (which is an example of a "fixed voltage" in the claims) $V_{PLL}$ is applied to the plate line PL during each of a page write operation, a page erase operation, and a page read operation for the dynamic flash memory cells according to the first embodiment of the present invention, with reference to FIGS. 6A to 6F.

Figure 6A:
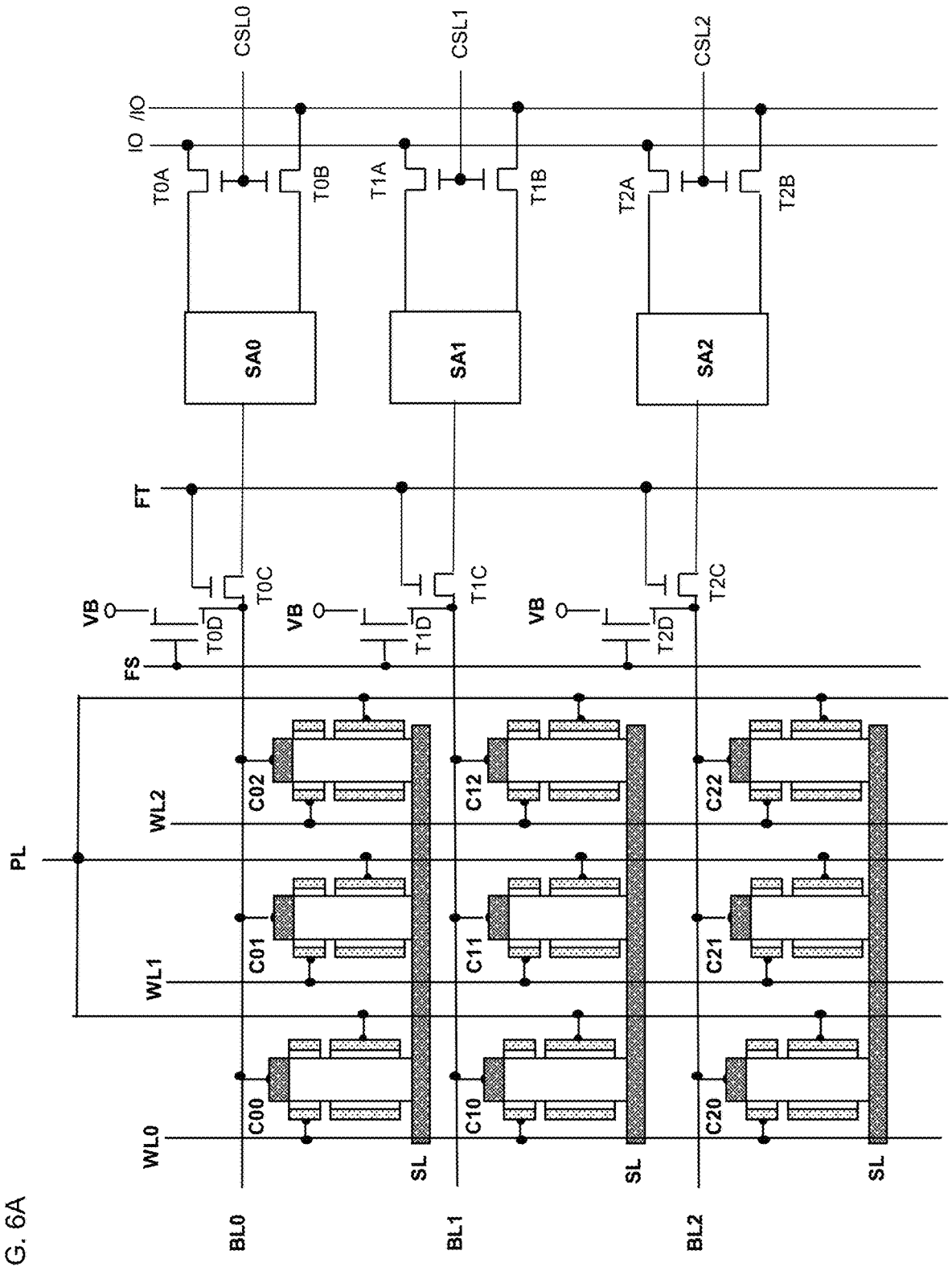
FIG. 6A is a circuit block diagram for illustrating that an identical fixed voltage is applied to a first drive control line during each of a page write operation, a page erase operation, and a page read operation for the memory apparatus including the SGTs according to the first embodiment.

In FIG. 6A, 3 rows×3 columns of memory cells C00 to C22 partially form a block. Although 3 rows×3 columns of the memory cells C00 to C22 are illustrated herein, the actual block has a matrix of memory cells with a size larger than 3 rows×3 columns. Word lines WL0 to WL2, a plate line PL common to at least 4 pages, a source line SL common to at least 2 pages, and bit lines BL0 to BL2 are connected to the respective memory cells. Transistors T0C to T2C whose gates receive a transfer signal FT form switch circuits (each of which is an example of a "switch circuit" in the claims). In addition, the drains of transistors T0D to T2D whose gates connect to an erase signal FS connect to a bit line erase signal VB, while the sources thereof respectively connect to the bit lines BL0 to BL2. The bit lines BL0 to BL2 respectively connect to sense amplifier circuits SA0 to SA2 (each of which is an example of a "sense amplifier circuit" in the claims) via the respective switch circuits. The sense amplifier circuits SA0 to SA2 connect to a pair of complementary input/output lines IO and/IO via transistors T0A to T2B whose gates connect to column selection lines CSL0 to CSL2.

Figure 6B:
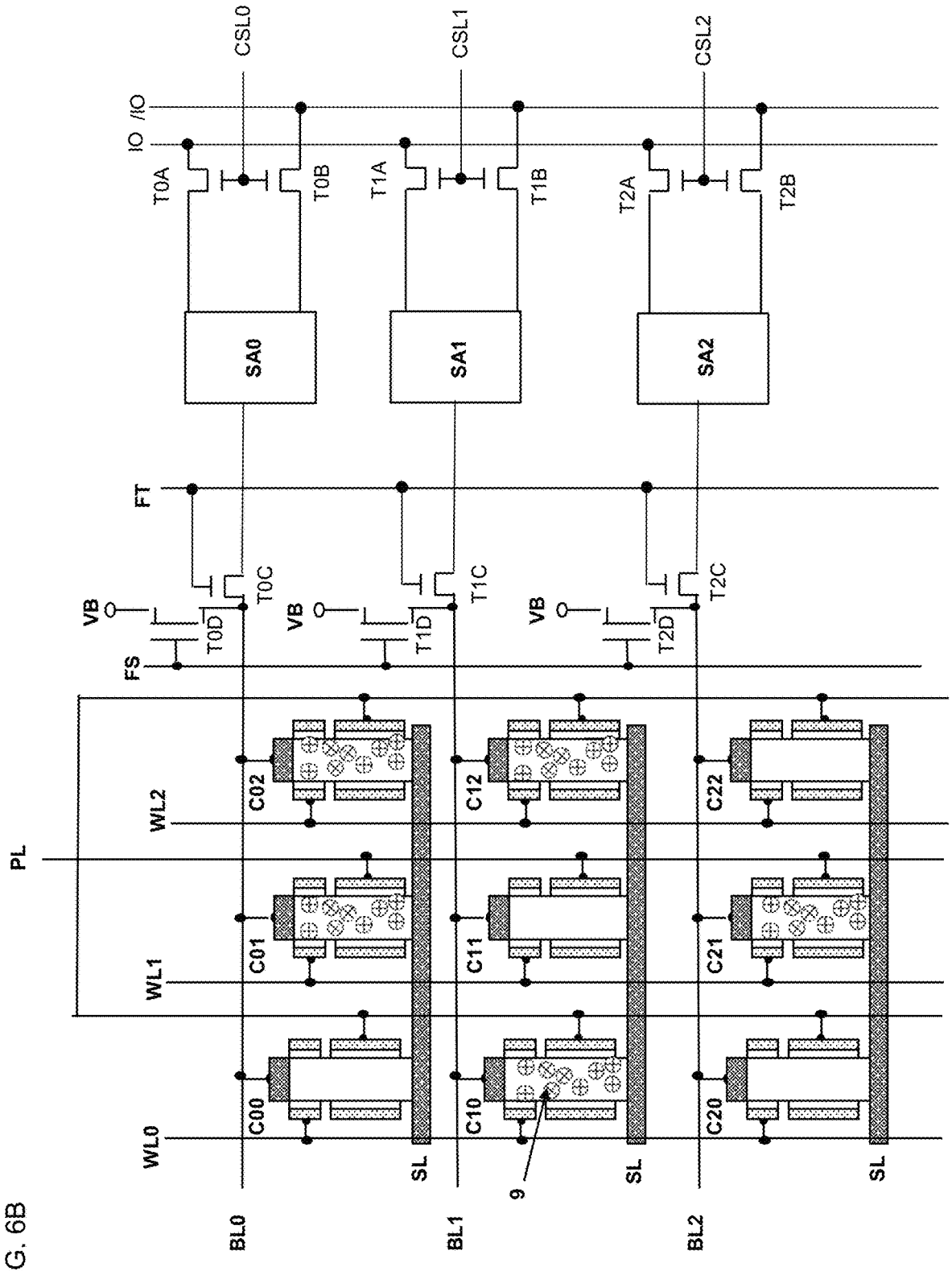
FIG. 6B is a circuit block diagram for illustrating that an identical fixed voltage is applied to the first drive control line during each of a page write operation, a page erase operation, and a page read operation for the memory apparatus including the SGTs according to the first embodiment.
Figure 6C:
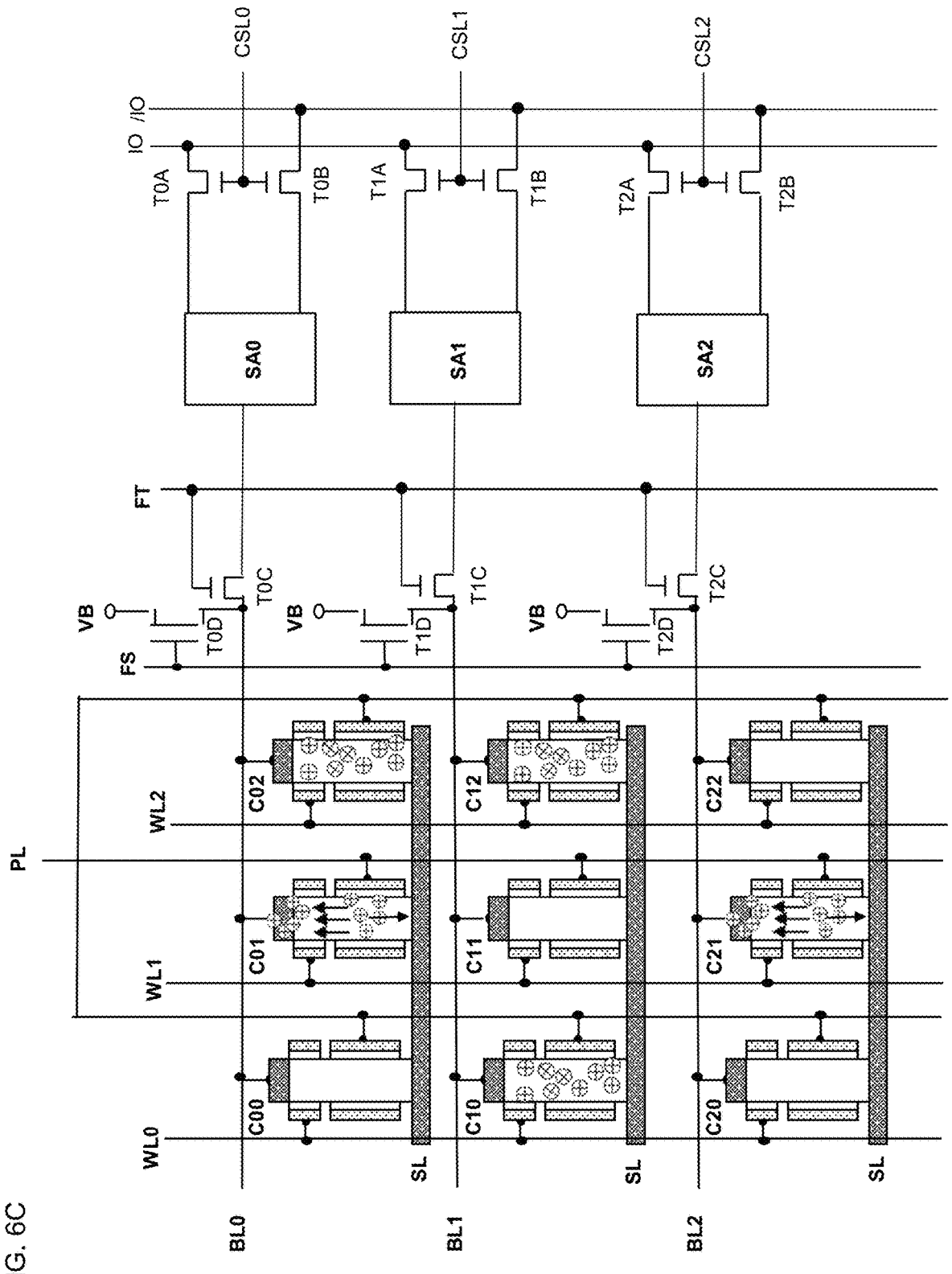
FIG. 6C is a circuit block diagram for illustrating that an identical fixed voltage is applied to the first drive control line during each of a page write operation, a page erase operation, and a page read operation for the memory apparatus including the SGTs according to the first embodiment.
Figure 6D:
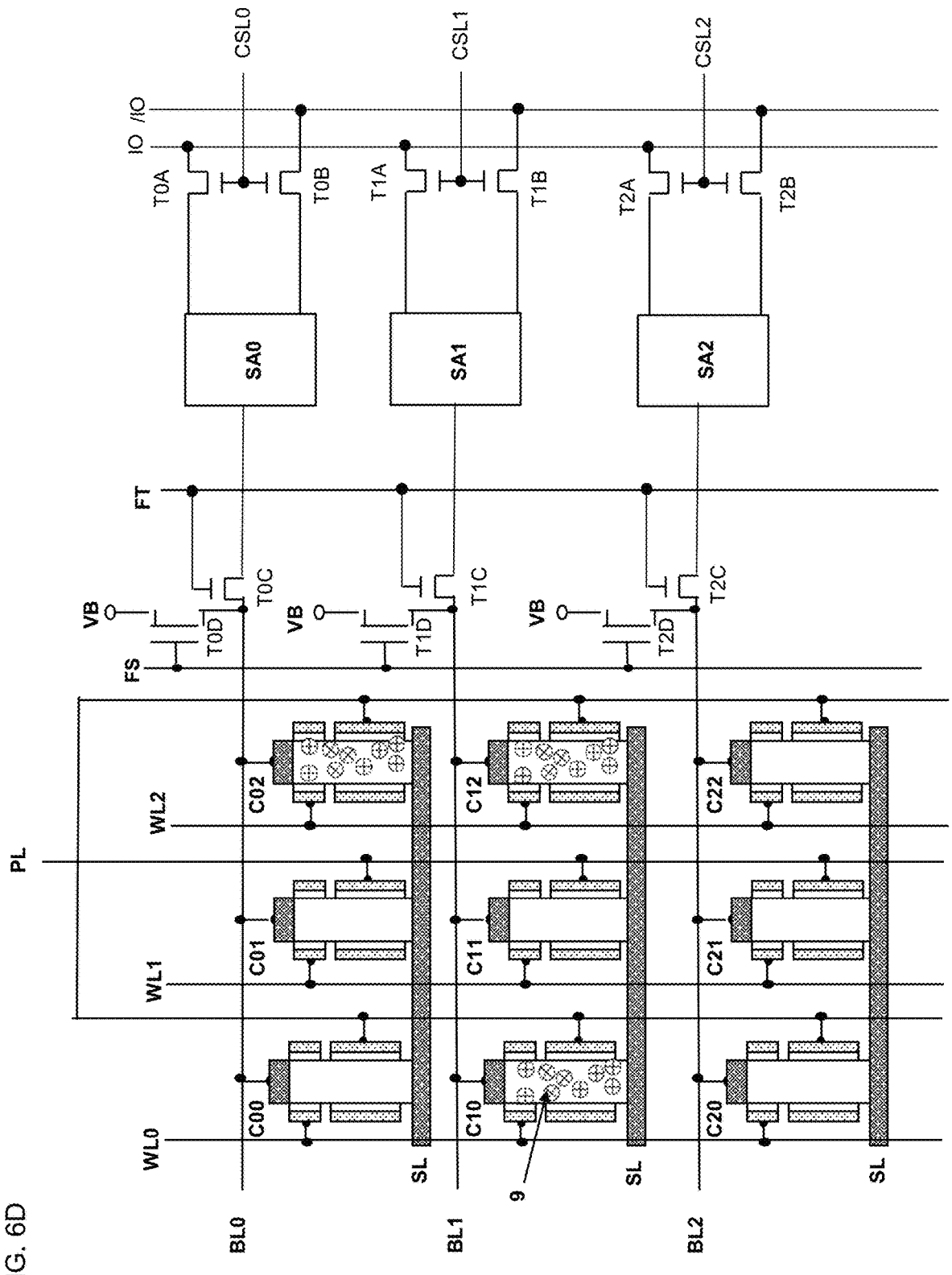
FIG. 6D is a circuit block diagram for illustrating that an identical fixed voltage is applied to the first drive control line during each of a page write operation, a page erase operation, and a page read operation for the memory apparatus including the SGTs according to the first embodiment.
Figure 6E:
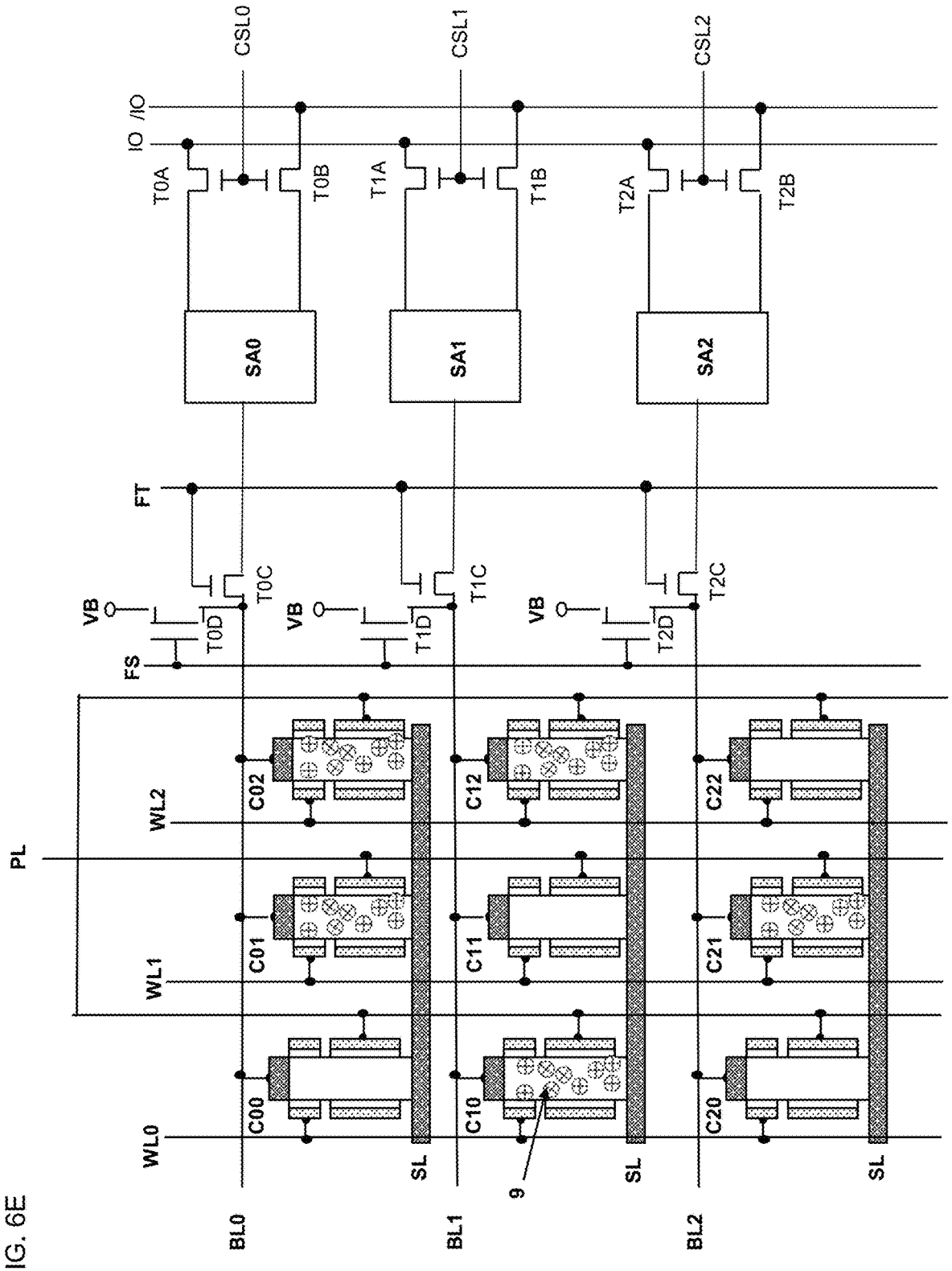
FIG. 6E is a circuit block diagram for illustrating that an identical fixed voltage is applied to the first drive control line during each of a page write operation, a page erase operation, and a page read operation for the memory apparatus including the SGTs according to the first embodiment.

FIG. 6B illustrates a view in which "1" is randomly written to the memory cells C01, C02, C10, C12, and C21 among the memory cells C00 to C22 at a given timing, and the holes 9 are thus stored in their channel semiconductor layers 7. With reference to FIG. 6B, an example will be described in which a group of memory cells C01, C11, and C21 (which is an example of a "group of memory cells" in the claims) connecting to the word line WL1 is selected, for example, and a page erase operation is performed on the group of memory cells. It should be noted that the group of memory cells herein is defined as the group of the memory cells C01, C11, and C21 selected by the word line WL1, but a plurality of such pages are arranged in the column direction to form a two-dimensional block. FIG. 6C illustrates a view in which the holes 9 in the memory cells C01 and C21, which store the write data "1," are pulled out by the bit lines BL0 and BL2 and the source line SL. It should be noted that in FIG. 6C, since a fixed voltage is applied to the plate line PL, most of the holes 9 are pulled out by the bit lines BL0 and BL2. FIG. 6D illustrates a state in which the holes 9 in the group of the memory cells C01, C11, and C21 have been pulled out. FIG. 6E illustrates a view in which the holes 9 are stored in the memory cells C01 and C21 and the write data "1" is thus stored therein.

Figure 6F:
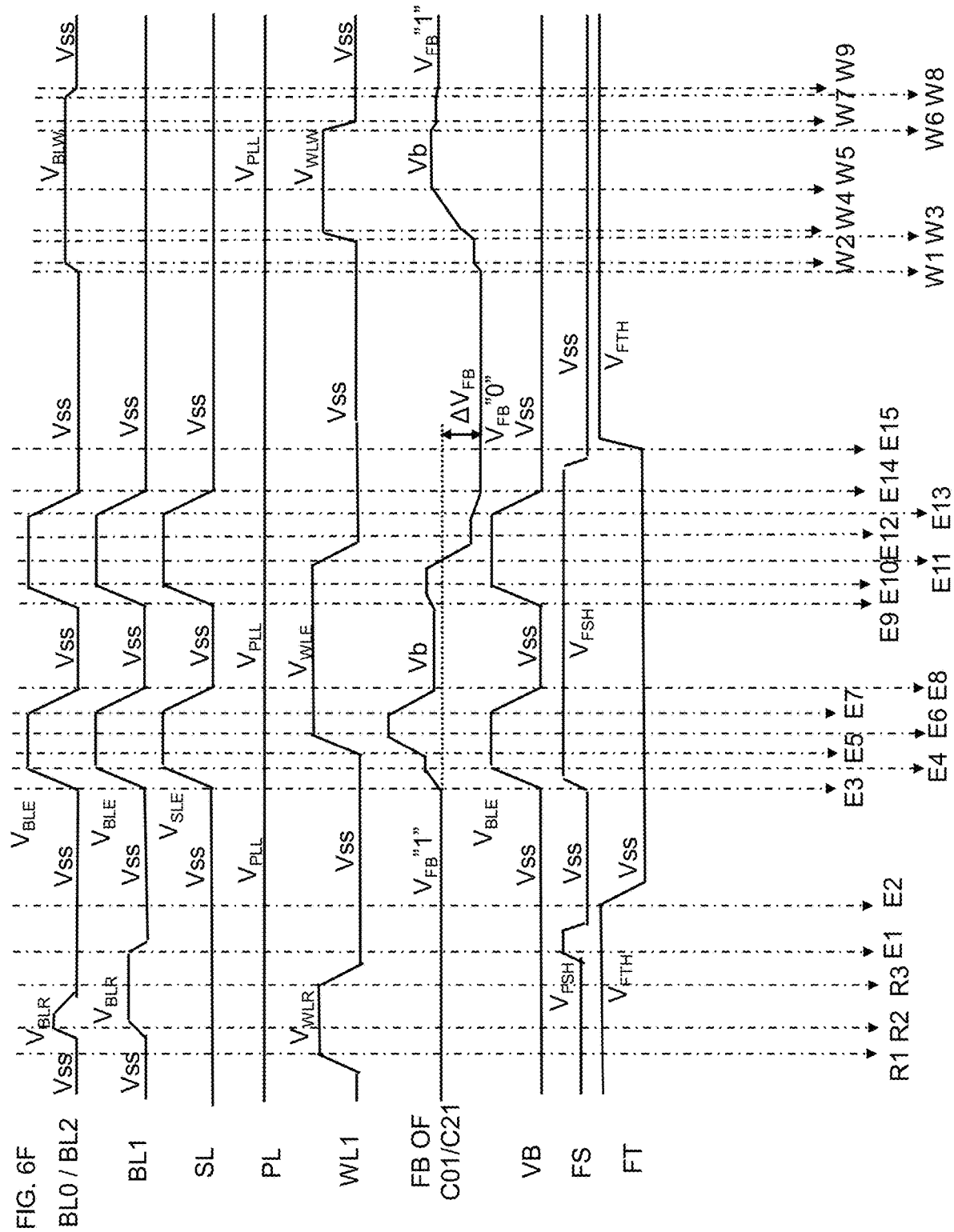
FIG. 6F is an operation waveform chart for illustrating that an identical fixed voltage is applied to the first drive control line during each of a page write operation, a page erase operation, and a page read operation for the memory apparatus including the SGTs according to the first embodiment.
Figure 7A:
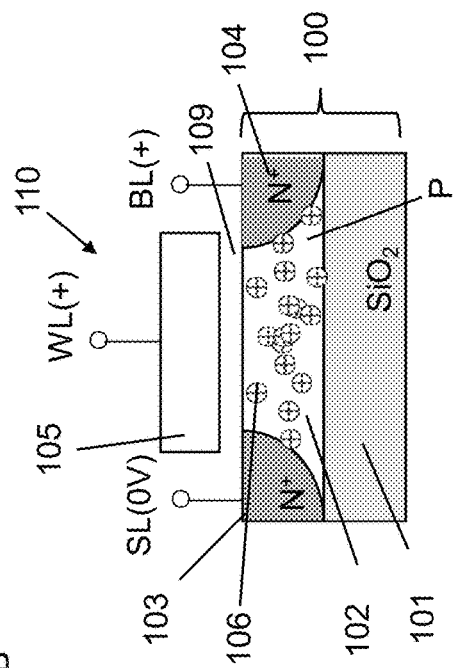
FIGS. 7A, 7B, 7C and 7D are views for illustrating a write operation for a conventional capacitorless DRAM memory cell.
Figure 7B:
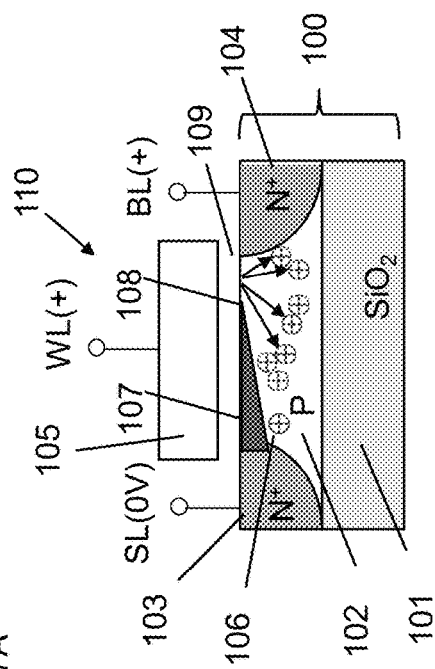
Figure 7C:
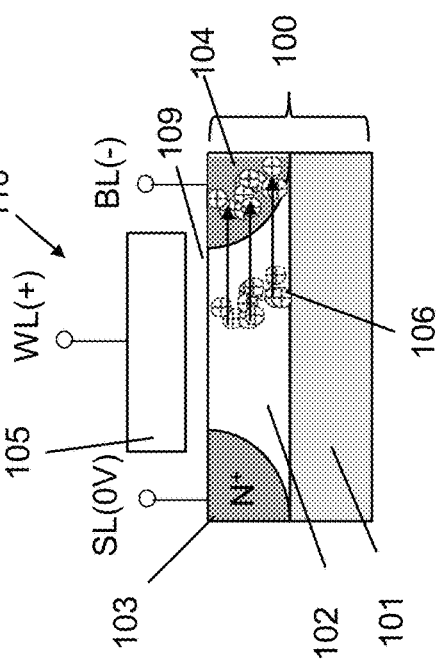
Figure 7D:
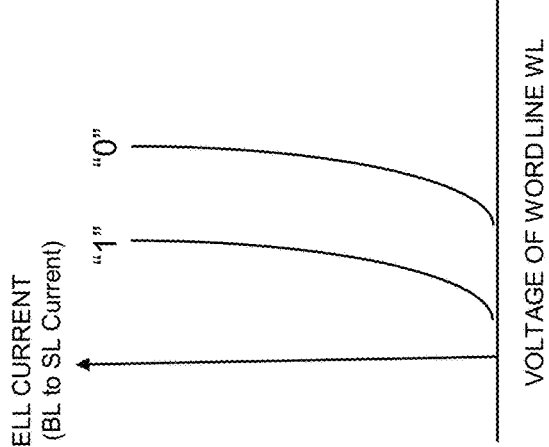
Figure 8A:
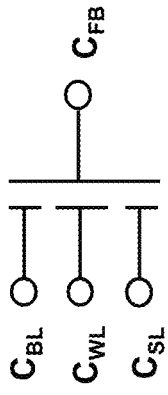
FIGS. 8A and 8B are views for illustrating problems with the operation of the conventional capacitorless DRAM memory cell.
Figure 8B:
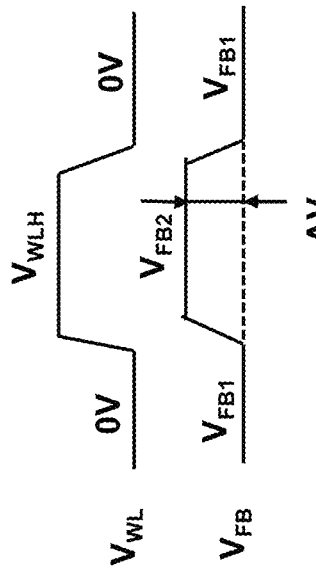

FIG. 6F illustrates a time-series operation waveform chart of FIG. 6A to 6E. With reference to FIG. 6F, description will be specifically made of a fact that an identical fixed voltage is applied to the plate line PL during each of a page write operation (which is an example of a "page write operation" in the claims), a page erase operation (which is an example of a "page erase operation" in the claims), and a page read operation (which is an example of a "page read operation" in the claims) for the dynamic flash memory cells according to the first embodiment of the present invention.

At times R1 to R3 illustrated in FIG. 6F, page data (which is an example of "page data" in the claims) stored in the group of the memory cells C01, C11, and C21 are respectively read by the sense amplifier circuits SA0 to SA2. At the time R1, the voltage of the word line WL1 connecting to the group of the memory cells C01, C11, and C21 rises from a low voltage Vss to a high voltage $V_{WLR}$ for reading, and at the time R2, the voltages of the bit lines BL0 to BL2 rise from the low voltage Vss to a high voltage $V_{BLR}$ for reading. Herein, Vss may be the ground voltage Vss=0 V, for example. At the time R3, the voltage of the word line WL1 drops from the high voltage $V_{WLR}$ for reading to the low voltage Vss. Meanwhile, the fixed voltage $V_{PLL}$ is applied to the plate line PL during the page read operation.

At times E1 to E15 in FIG. 6F, a page erase operation is performed. When the page erase operation is started at the time E1, the voltage of the erase signal FS rises from Vss to $V_{FSH}$, and the voltage of the bit line BL1 is reset and thus drops to Vss. Since the write data "1" has been read from each of the memory cells C01 and C21 respectively connecting to the bit lines BL0 and BL2, the voltages of the bit lines BL0 and BL2 have dropped from the high voltage $V_{BLR}$ for reading to the low voltage Vss.

At the times E3 to E14 in FIG. 6F, the voltages of the bit lines BL0 to BL2 oscillate between Vss and $V_{BLE}$ during the page erase operation. In synchronism with the bit lines BL0 to BL2, a pulse voltage (which is an example of a "pulse voltage" in the claims) identical to those of the bit lines BL0 to BL2 is applied to the source line SL. Thus, even when the voltages of the bit lines BL0 to BL2 and the source line SL respectively oscillate between Vss and $V_{BLE}$ and between Vss and $V_{SLE}$ during the page erase operation, no memory cell current flows through respective memory cells C01, C11, and C21 in the group of the memory cells selected by the word line WL1, and thus, there is no hole 9 generated through impact ionization. Herein, the high voltage $V_{BLE}$ of each of the bit lines BL0 to BL2 during the page erase operation and the high voltage $V_{SLE}$ of the source line SL during the page erase operation are identical. In addition, at the time E3, the voltage of the erase signal FS rises from Vss to $V_{FSH}$, and the bit line erase signal VB is supplied to the bit lines BL0 to BL2 from the drains of the respective transistors T0D to T2D. Consequently, the voltage of each of the bit lines BL0 to BL2 can oscillate between Vss and $V_{BLE}$ during the page erase operation. In addition, the source line SL is provided in common to a plurality of pages, and is connected to a decoder circuit and a pulse generation circuit (not illustrated) so that a pulse voltage identical to those of the bit lines BL can be applied to the source line SL in synchronism with the bit lines BL during the page erase operation. It should be noted that a page erase operation for pulling out the holes 9 by the other bit lines is similar to that described with reference to FIG. 4BA, but differs in that in FIG. 6F, the fixed voltage $V_{PLL}$ is applied to the plate line PL. Herein, each of the high voltage $V_{WLE}$ of the word line and the high voltage $V_{BLE}$ of each bit line is a high voltage for the page erase operation. As illustrated in FIG. 6C, the holes 9 in the memory cells C01 and C21, which store the write data "1," are respectively pulled out by the bit lines BL0 and BL2. Then, as illustrated in FIG. 6D, the holes 9 in the first group of the memory cells C01, C11, and C21 have been pulled out.

When the page erase operation terminates at the time E14 illustrated in FIG. 6F, the voltage of the transfer signal FT changes from Vss to $V_{FTH}$ at the time E15, and the transistors T0C to T2C are thus turned on to non-conductive state. Consequently, the bit lines BL0 to BL2 respectively connect to the sense amplifier circuits SA0 to SA2. At times W1 to W9, a page write operation is performed by writing page data, which have been written to the sense amplifier circuits SA0 to SA2, to the group of the memory cells C01, C11, and C21 selected by the word line WL1. The other page write operations are similar to those described with reference to FIG. 3AB. Herein, each of the high voltage $V_{WLW}$ of the word line and the high voltage $V_{BLW}$ of each bit line is a high voltage for the page write operation. FIG. 6E illustrates a view in which the holes 9 are stored in the memory cells C01 and C21 that have stored the write data "1." Herein, the identical fixed voltage $V_{PLL}$ is applied to the plate line PL during the page read operation and the page write operation.

The circuit block illustrated in FIGS. 6A to 6E allows page data in the first group of the memory cells C01, C11, and C21, which have been respectively read by the sense amplifier circuits SA0 to SA2, to be output to the complementary input/output lines IO and/IO during a page erase operation for the memory apparatus including the dynamic flash memory cells according to the first embodiment of the present invention. Hereinafter, specific description will be made with reference to FIG. 6G.

A case illustrated in FIG. 6G is considered where memory data in the memory cells C01, C11, and C21 are selected by the word line WL1 and are respectively read into the bit lines BL0 to BL2. During the page read operation, the transfer signal FT is at $V_{FTH}$, and the transistors T0C to T2C that are the switch circuits are thus on to non-conductive state. Thus, the memory data in the memory cells C01, C11, and C21 are respectively read by the sense amplifier circuits SA0 to SA2, and whether the logic level of the data is "0" or "1" is determined therein. Then, when a page erase operation starts, the voltage of the transfer signal FT drops from $V_{FTH}$ to Vss, and the transistors T0C to T2C that are the switch circuits are thus turned off to non-conductive state. Consequently, the bit lines BL0 to BL2 are respectively electrically disconnected from the sense amplifier circuits SA0 to SA2. During the page erase operation, the page data stored in the memory cells C01, C11, and C21 are erased, for example. In this example, data "1" in the memory cell C01, data "0" in the memory cell C11, and data "1" in the memory cell C21 are all erased, so that data "0" results. The sense amplifier circuits SA0 to SA2 respectively store the page data read from the memory cells C01, C11, and C21. Next, the column selection lines CSL0 to CSL2 are sequentially connected to the gates of the transistors T0A to T2B so that the page data stored in the sense amplifier circuits SA0 to SA2 are output to the complementary input/output lines IO and/IO.

In this manner, when the bit lines and the sense amplifier circuits are electrically disconnected by the respective switch circuits T0C to T2C, page data stored in the sense amplifier circuits can be freely read during a page erase operation. Thus, the page erase operation can be performed as a background operation behind the page read operation. Consequently, a memory apparatus compatible with a high-speed system can be provided.

The dynamic flash memory operation described in the present embodiment can be performed regardless of whether the horizontal cross-sectional shape of the Si pillar 2 in FIG. 1 is circular, elliptical, or rectangular. In addition, dynamic flash memory cells having Si pillars 2 with circular, elliptical, and rectangular horizontal cross-sections may be provided in a mixed manner on an identical chip.

A dynamic flash memory device has been described with reference to FIG. 1 regarding an example of a SGT in which the first gate insulating layer 4a and the second gate insulating layer 4b are provided around the entire side face of the Si pillar 2 disposed in an upright position on a substrate along the vertical direction, and the first gate conductor layer 5a and the second gate conductor layer 5b are respectively provided around the entire first gate insulating layer 4a and the entire second gate insulating layer 4b. As described in the present embodiment, it is acceptable as long as the present dynamic flash memory device has a structure that satisfies the condition that the holes 9 generated through an impact ionization phenomenon are retained in the channel region 7. To this end, it is acceptable as long as the channel region 7 has a floating body structure isolated from the substrate. Accordingly, even when the semiconductor base material of the channel region is formed horizontally on the substrate using the GAA (Gate All Around; for example, see Non Patent Literature 10) technology, which is one of SGTs, or the nanosheet technology (for example, see Non Patent Literature 11), for example, the aforementioned dynamic flash memory operation can be performed. Alternatively, a device structure using SOI (Silicon On Insulator; for example, see Non Patent Literatures 7 to 10) may also be used. In such a device structure, the bottom of the channel region is in contact with an insulating layer of a SOI substrate, and the channel region is surrounded by a gate insulating layer and device isolation insulating layers together with other channel regions. Even in such a structure, the channel region has a floating body structure. In this manner, it is acceptable as long as the dynamic flash memory device provided by the present embodiment satisfies the condition that its channel region has a floating body structure. Further, even with a structure in which a Fin transistor (for example, see Non Patent Literature 13) is formed on a SOI substrate, the present dynamic flash operation can be performed as long as its channel region has a floating body structure.

To write "1," it is also possible to generate electron-hole pairs using a gate induced drain leakage (GIDL) current (for example, see Non Patent Literature 14), and then fill the channel region 7 with the generated holes.

Expressions (1) to (12) in the present specification and drawings are only used to qualitatively describe phenomena. Thus, such expressions are not intended to limit the phenomena.

Although each of the reset voltages of the word line WL, the bit line BL, and the source line SL is indicated by Vss in the description made with reference to FIGS. 3AA to 3AC and 3B, the reset voltages may be different voltages.

In FIG. 4A and its related description, exemplary conditions of a page erase operation have been illustrated. In contrast, it is also possible to change the voltage applied to each of the source line SL, the plate line PL, the bit line BL, and the word line WL as long as the state of removing the holes 9 in the channel region 7 from one or both of the N$^+$ layer 3a and the N$^+$ layer 3b is achieved. In addition, in a page erase operation, it is also possible to apply a voltage to the source line SL and bring the bit line BL into a floating state in the selected page. Alternatively, in a page erase operation, it is also possible to apply a voltage to the bit line BL and bring the source line SL into a floating state in the selected page.

In FIG. 1, in a portion of the channel region 7 surrounded by the insulating layer 6 as the first insulating layer in the vertical direction, potential distributions of the first channel region 7a and the second channel region 7b are formed continuously. Accordingly, the channel region 7 including the first channel region 7a and the second channel region 7b is continuous in the vertical direction across its region surrounded by the insulating layer 6 as the first insulating layer.

It should be noted that in FIG. 1, it is desirable that the length in the vertical direction of the first gate conductor layer 5a connecting to the plate line PL be made further longer than the length in the vertical direction of the second gate conductor layer 5b connecting to the word line WL so that $C_{PL} > C_{WL}$. However, it is possible to reduce the capacitive coupling ratio ($C_{WL}/(C_{PL}+C_{WL}+C_{BL}+C_{SL})$) of the word line WL to the channel region 7 only by adding the plate line PL. Consequently, potential fluctuation $\Delta V_{FB}$ of the channel region 7 as the floating body becomes small.

In addition, as the voltage $V_{PLL}$ of the plate line PL, a fixed voltage of about 1 V may be applied, for example.

It should be noted that the term "cover" as included in the following phrase: "the gate insulating layer, the gate conductor layer, or the like covers the channel or the like" in the present specification and claims includes a case where the channel or the like is entirely covered as in a SGT or a GAA, a case where the channel or the like is partially covered as in a Fin transistor, and a case where the channel or the like overlaps a planar object as in a planar transistor.

In FIG. 1, the first gate conductor layer 5a surrounds the entire first gate insulating layer 4a. In contrast, the first gate conductor layer 5a may partially surround the first gate insulating layer 4a as seen in plan view. In such a case, the outer side of the first gate insulating layer not covered with the first gate conductor layer 5a may be covered with an insulating layer or a third gate conductor layer electrically isolated from the first gate conductor layer. It should be noted that when such a third gate conductor layer is provided, the dynamic flash memory operation can be performed by applying a constant voltage or a pulse voltage to the third gate conductor layer. In addition, with a structure in which the first gate conductor layer 5a partially surrounds the first gate insulating layer 4a as seen in plan view as described above, many holes can be stored in the first channel region 7a.

Although a page refresh operation for a 1-bit dynamic flash memory cell including a single semiconductor base material has been described with reference to FIGS. 6A to 6G, the present invention is also effective for each operation mode of a 1-bit high-speed dynamic flash memory cell including two semiconductor base materials that stores complementary data of "1" and "0."

In addition, in FIG. 1, the first gate conductor layer 5a may be split into two or more conductor layers, and the resulting two or more conductor layers may be operated as conductor electrodes for the plate line synchronously or asynchronously and with the same drive voltage or different drive voltages. Similarly, the second gate conductor layer 5b may be split into two or more conductor layers, and the resulting two or more conductor layers may be operated as conductor electrodes for the word line synchronously or asynchronously and with the same drive voltage or different drive voltages. Even with such a structure, the dynamic flash memory operation can be performed. When the first gate conductor layer 5a is split into two or more conductor layers, at least one of the resulting conductor layers of the first gate conductor layer performs the role of the aforementioned first gate conductor layer 5a. Regarding the second gate conductor layer 5b split into two or more conductor layers also, at least one of the resulting conductor layers of the second gate conductor layer performs the role of the aforementioned second gate conductor layer 5b.

In FIG. 1, the first gate conductor layer 5a may connect to the word line WL, and the second gate conductor layer 5b may connect to the plate line PL. Even with such a structure, the present dynamic flash memory operation described above can be performed.

The aforementioned conditions of the voltages applied to the bit line BL, the source line SL, the word line WL, and the plate line PL as well as the voltage of the floating body are only examples for performing the basic operation including an erase operation, a write operation, and a read operation. Thus, other voltage conditions may also be employed as long as the basic operation of the present invention can be performed.

The present embodiment has the following features.

Feature 1

In the dynamic flash memory cell of the present embodiment, the N$^+$ layers 3a and 3b serving as the source and the drain, the channel region 7, the first gate insulating layer 4a, the second gate insulating layer 4b, the first gate conductor layer 5a, and the second gate conductor layer 5b are formed in a pillar shape as a whole. In addition, the N$^+$ layer 3a serving as the source connects to the source line SL, the N$^+$ layer 3b serving as the drain connects to the bit line BL, the first gate conductor layer 5a connects to the plate line PL, and the second gate conductor layer 5b connects to the word line WL. The dynamic flash memory cell has such a structure that the gate capacitance of the first gate conductor layer 5a connecting to the plate line PL is larger than the gate capacitance of the second gate conductor layer 5b connecting to the word line WL. In the present dynamic flash memory cell, the first gate conductor layer and the second gate conductor layer are stacked in the vertical direction. Therefore, even though the dynamic flash memory cell has such a structure that the gate capacitance of the first gate conductor layer 5a connecting to the plate line PL is larger than the gate capacitance of the second gate conductor layer 5b connecting to the word line WL, an increase in the memory cell area as seen in plan view can be avoided. Accordingly, higher performance and a higher degree of integration of the dynamic flash memory cell can be achieved at the same time.

Feature 2

During each of a page write operation, a page erase operation, and a page read operation for the dynamic flash memory cell according to the first embodiment of the present invention, an identical fixed voltage $V_{PLL}$ is applied to the plate line PL, whereby it is possible to maintain a stable state of the channel semiconductor layer 7 functioning as a floating body in each memory cell and thus provide a highly reliable memory apparatus. In addition, during a page erase operation, page data read by the sense amplifier circuits in advance can be read out to the outside of the chip. Thus, the system flexibility of the system significantly improves. Consequently, a higher-speed operation of the system can be achieved.

Feature 3

A focus is now placed on the role of the first gate conductor layer 5a, which connects to the plate line PL, of the dynamic flash memory cell according to the first embodiment of the present invention. The voltage of the word line WL oscillates up and down while a write operation or a read operation is performed on the dynamic flash memory cell. At this time, the plate line PL performs the role of reducing the capacitive coupling ratio between the word line WL and the channel region 7. Consequently, it is possible to significantly suppress the influence of changes in the voltage of the channel region 7 when the voltage of the word line WL oscillates up and down. Accordingly, it is possible to increase the difference between the threshold voltages of the transistor region on the side of the word line WL corresponding to logic levels of "0" and "1." This leads to an increased operation margin of the dynamic flash memory cell.

Feature 4

In FIGS. 6A to 6E, the plate line PL may be used in common by the block of the memory cells C00 to C22, for example. Consequently, it becomes possible to not only simplify the process and the circuit but also increase the operation speed.

(Other embodiments)

Although Si pillars are formed in the present invention, it is also possible to form semiconductor pillars of a semiconductor material other than Si. This is also true of the other embodiments according to the present invention.

In a vertical NAND flash memory circuit, a plurality of memory cells, each including a semiconductor pillar as a channel and also including a tunnel oxide layer, a charge storage layer, an interlayer dielectric layer, and a control conductor layer surrounding the semiconductor pillar, are formed in the vertical direction. A source-line impurity layer corresponding to a source and a bit-line impurity layer corresponding to a drain are provided at opposite ends of the semiconductor pillar in each memory cell. In addition, if one of memory cells on the opposite sides of a single memory cell serves the role of a source, the other serves the role of a drain. As described above, the vertical NAND flash memory circuit is one of SGT circuits. Thus, the present invention is also applicable to a mixed circuit including a NAND flash memory circuit.

When writing "1," it is also possible to generate electron-hole pairs through an impact ionization phenomenon using a gate induced drain leakage (GIDL) current described in Non Patent Literature 10 and Non Patent Literature 14, and then fill the floating body FB with the generated holes. This is also true of the other embodiments according to the present invention.

In FIG. 1, the dynamic flash memory operation can also be performed with a structure obtained by reversing the polarity of the conductivity type of each of the $N^+$ layers 3a and 3b and the Si pillar 2 as the P-layer. In such a case, the majority carriers in the n-type Si pillar 2 are electrons. Thus, electrons generated through impact ionization are stored in the channel region 7, and the channel region 7 is thus set to the state "1."

The present invention can be implemented in various embodiments and modifications without departing from the broad spirit and scope of the present invention. In addition, each of the aforementioned embodiments only describes an example of the present invention and is not intended to limit the scope of the present invention. The aforementioned examples and modified examples can be combined as appropriate. Further, even if some of the components of the aforementioned embodiments are removed as necessary, the resulting structure is within the technical idea of the present invention.

INDUSTRIAL APPLICABILITY

With the memory apparatus using the semiconductor devices according to the present invention, it is possible to obtain dynamic flash memory that is a memory apparatus using high-density and high-performance SGTs.

The invention claimed is:

1. A memory apparatus using semiconductor devices, comprising:
   a plurality of memory cells arranged in a row direction on a substrate to form a plurality of pages, the pages being arranged in a column direction,
   wherein:
   each memory cell included in each of the plurality of pages includes
      a semiconductor base material provided on the substrate in a manner standing in an upright position along a vertical direction or extending in a horizontal direction with respect to the substrate,
      a first impurity layer and a second impurity layer at opposite ends of the semiconductor base material,
      a first gate insulating layer partially or entirely surrounding a side face of the semiconductor base material between the first impurity layer and the second impurity layer, the first gate insulating layer being in contact with or located in proximity to the first impurity layer,
      a second gate insulating layer surrounding the side face of the semiconductor base material, the second gate insulating layer being continuous with the first gate insulating layer and being in contact with or located in proximity to the second impurity layer,
      a first gate conductor layer partially or entirely covering the first gate insulating layer,
      a second gate conductor layer covering the second gate insulating layer, and
      a channel semiconductor layer of the semiconductor base material covered with the first gate insulating layer and the second gate insulating layer,
   a voltage applied to each of the first gate conductor layer, the second gate conductor layer, the first impurity layer, and the second impurity layer is controlled to perform a page write operation or a page erase operation,
   the first impurity layer in the memory cell connects to a source line, the second impurity layer connects to a bit line, one of the first gate conductor layer and the second gate conductor layer connects to a word line, and another of the first gate conductor layer and the second gate conductor layer connects to a first drive control line, the bit line connects to a sense amplifier circuit via a switch circuit, during a page read operation, page data in a group of memory cells selected by the word line is read by the sense amplifier circuit, and during each of the page write operation, the page erase operation, and the page read operation, an identical fixed voltage is applied to the first drive control line.

2. The memory apparatus using the semiconductor devices according to claim 1, wherein during the page erase operation, a pulse voltage identical to a pulse voltage of the bit line is applied to the source line in synchronism with the bit line.

3. The memory apparatus using the semiconductor devices according to claim 1, wherein during the page erase operation, the switch circuit is turned off to non-conductive state, and the page data stored in the sense amplifier circuit is read.

4. The memory apparatus using the semiconductor devices according to claim 1, wherein the page data stored in the sense amplifier circuit is memory data read from a memory cell before the page erase operation is started.

5. The memory apparatus using the semiconductor devices according to claim 1, wherein the first drive control line is provided in common to at least two of the pages.

6. The memory apparatus using the semiconductor devices according to claim 1, wherein the source line is provided in common to at least two of the pages.

7. The memory apparatus using the semiconductor devices according to claim 1, wherein a first gate capacitance between the first gate conductor layer and the channel semiconductor layer is larger than a second gate capacitance between the second gate conductor layer and the channel semiconductor layer.

8. The memory apparatus using the semiconductor devices according to claim 1, wherein the first gate conductor layer is separated into two conductor layers while surrounding the first gate insulating layer as seen in plan view.

9. The memory apparatus using the semiconductor devices according to claim 1, wherein during the page write operation, holes generated through an impact ionization phenomenon are retained in the channel semiconductor layer, and a voltage of the channel semiconductor layer is set to a first data retention voltage that is higher than one or both of a voltage of the first impurity layer and a voltage of the second impurity layer, and during the page erase operation, a voltage applied to each of the first impurity layer, the second impurity layer, the first gate conductor layer, and the second gate conductor layer is controlled so that the holes are pulled out from one or both of the first impurity layer and the second impurity layer, and the voltage of the channel semiconductor layer is set to a second data retention voltage that is lower than the first data retention voltage.

* * * * *

UNITED STATES PATENT AND TRADEMARK OFFICE
CERTIFICATE OF CORRECTION

| | | |
|---|---|---|
| PATENT NO. | : 12,185,522 B2 | Page 1 of 1 |
| APPLICATION NO. | : 17/735431 | |
| DATED | : December 31, 2024 | |
| INVENTOR(S) | : Koji Sakui and Nozomu Harada | |

It is certified that error appears in the above-identified patent and that said Letters Patent is hereby corrected as shown below:

On the Title Page

Under item (56), "OTHER PUBLICATIONS", Lines 3-4, delete "99. 573-578 (1991)" and replace with --pp. 573-578 (1991)--

Signed and Sealed this
Fourth Day of February, 2025

Coke Morgan Stewart
*Acting Director of the United States Patent and Trademark Office*